US011824522B2

(12) United States Patent
Schulz et al.

(10) Patent No.: US 11,824,522 B2
(45) Date of Patent: Nov. 21, 2023

(54) ELECTROACOUSTIC FILTER WITH MODIFIED PHASE CHARACTERISTICS

(71) Applicant: RF360 Singapore Pte. Ltd., Singapore (SG)

(72) Inventors: Volker Schulz, Munich (DE); Gerhard Kloska, Rosenheim (DE); Ibrahim Mehinovic, Munich (DE); Philipp Schwegler, Munich (DE)

(73) Assignee: RF360 Singapore Pte. Ltd., San Diego, CA (US)

( * ) Notice: Subject to any disclaimer, the term of this patent is extended or adjusted under 35 U.S.C. 154(b) by 272 days.

(21) Appl. No.: 17/095,662

(22) Filed: Nov. 11, 2020

(65) Prior Publication Data

US 2022/0149815 A1    May 12, 2022

(51) Int. Cl.
*H03H 9/54*    (2006.01)
*H03H 9/72*    (2006.01)
*H03H 7/01*    (2006.01)

(52) U.S. Cl.
CPC ............ *H03H 9/545* (2013.01); *H03H 9/542* (2013.01); *H03H 9/72* (2013.01); *H03H 7/0115* (2013.01)

(58) Field of Classification Search
CPC .......... H03H 9/545; H03H 9/542; H03H 9/72; H03H 7/0115
See application file for complete search history.

(56) References Cited

U.S. PATENT DOCUMENTS

| | | | |
|---|---|---|---|
| 6,351,197 B1 | 2/2002 | Selmeier et al. | |
| 2004/0130411 A1* | 7/2004 | Beaudin | H03H 9/6433 333/195 |
| 2015/0130680 A1 | 5/2015 | Link et al. | |
| 2017/0302252 A1* | 10/2017 | Hey-Shipton | H04B 1/40 |
| 2017/0366166 A1* | 12/2017 | Hey-Shipton | H03H 9/6483 |
| 2018/0026605 A1 | 1/2018 | Ito et al. | |
| 2018/0131344 A1 | 5/2018 | Komatsu | |
| 2018/0159506 A1 | 6/2018 | Ito | |
| 2019/0036554 A1 | 1/2019 | Ito et al. | |
| 2019/0089335 A1 | 3/2019 | Sauer et al. | |

(Continued)

FOREIGN PATENT DOCUMENTS

| | | |
|---|---|---|
| DE | 102018112839.8 | 12/2019 |
| JP | 2018019392 A * | 2/2018 |
| WO | 2019154655 | 8/2019 |

OTHER PUBLICATIONS

International Search Report and Written Opinion—PCT/EP2021/079818—ISA/EPO—dated Feb. 10, 2022.

*Primary Examiner* — Samuel S Outten
(74) *Attorney, Agent, or Firm* — Polsinelli

(57) ABSTRACT

Aspects of the disclosure relate to wireless communication, and high-frequency filters with resonators configured to systematically modify phase characteristics of an antenna reflection coefficient. One example is a wireless communication apparatus for a multi-band system comprising a frequency band filter circuit having a filter passband that includes a first band of the multi-band system. The frequency band filter circuit comprises a plurality of resonators coupled between an antenna port and a signal port and a resonant structure electrically coupled to the plurality of resonators. The resonant structure has a resonance outside of the first band and a second band of the multi-band system, the resonance being closer to the second band than to the first band.

27 Claims, 18 Drawing Sheets

(56) References Cited

U.S. PATENT DOCUMENTS

| | | |
|---|---|---|
| 2019/0123717 A1 | 4/2019 | Gavryliuk et al. |
| 2019/0149131 A1 | 5/2019 | Kido |
| 2019/0149312 A1 | 5/2019 | Takamine |
| 2019/0245518 A1* | 8/2019 | Ito .................... H03H 9/02637 |
| 2019/0356302 A1* | 11/2019 | Yasuda .................... H03H 9/70 |
| 2020/0014370 A1* | 1/2020 | Matsubara ............. H03H 9/568 |
| 2020/0204158 A1 | 6/2020 | Nosaka |
| 2021/0058067 A1 | 2/2021 | Heijna |
| 2022/0329226 A1* | 10/2022 | Urata ....................... H04B 1/00 |
| 2022/0337223 A1* | 10/2022 | Wagner ................. H03H 9/568 |

* cited by examiner

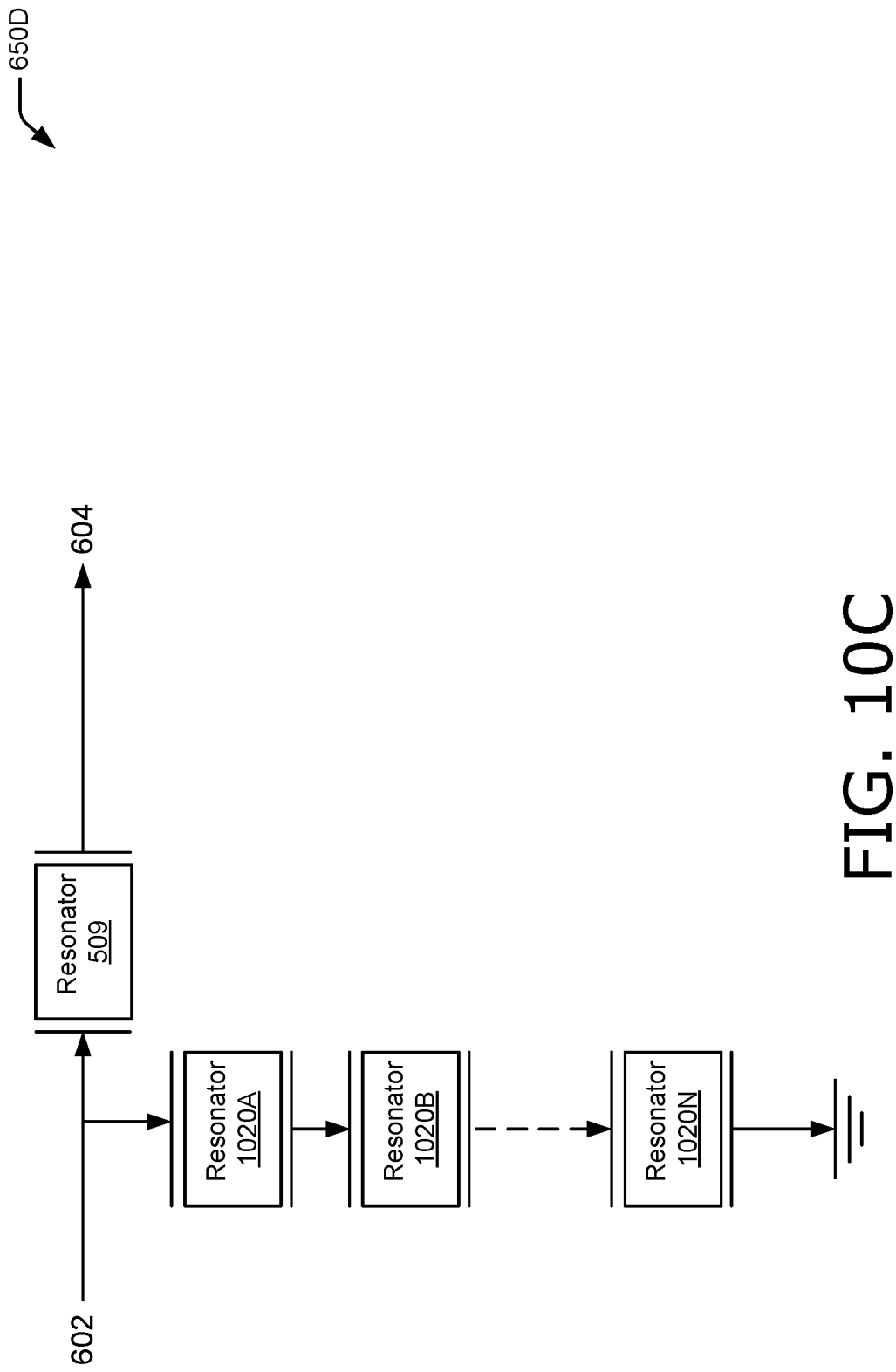

ELECTROACOUSTIC FILTER WITH MODIFIED PHASE CHARACTERISTICS

FIELD

The present disclosure relates generally to wireless communication, and in particular to high-frequency filters in a multi-band communication device that can be implemented with electroacoustic resonators configured to systematically modify phase characteristics of an antenna reflection coefficient.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

Aspects of the present disclosure describe filter circuits for multi-band communication systems that are modified with resonant structures configured to systematically modify phase characteristics of an antenna reflection coefficient. Communication technologies are changing to improve communication performance by using wider frequency bands with associated wider bandwidth filters. To implement additional frequency usage, the number of bands in use by a single transceiver circuit can be increased. In such devices, different RF filters can be coupled to a single antenna to efficiently use device resources. An idealized and unachievable abstract model of a filter for a particular band can have an antenna reflection coefficient that reflects energy for frequencies outside of the particular band. The idealized filter can also be described as a filter that shows the condition for a perfect open-circuit for counter band frequencies. Real world filters, however, have a magnitude of antenna reflection coefficient that is less than one and a frequency dependent phase angle for all but one single frequency point, and so the ideal characteristics are not possible over the varying frequencies covered by communication bands. One of the values that can be used to characterize the performance of a filter over a given frequency range is the phase angle of the antenna reflection coefficient.

Aspects of the disclosure described herein use one or more resonant structures in the signal propagation path of RF filters (e.g., electroacoustic filters) to modify the phase characteristics of the antenna reflection coefficient for the RF filter. In some examples, the resonant structures operate such that the associated resonance frequency or frequencies are localized outside the communication frequency bands in a multi-band system, but impact the performance within the communication frequency bands. In some cases, the resonance added by the resonant structures manipulates the phase spread in the communication bands, improving performance for multi-band devices with limited or no increase in space utilization.

In one illustrative example, a wireless communication apparatus is provided. The wireless communication apparatus comprises: a frequency band filter circuit for a first band of the multi-band system, the frequency band filter circuit comprising: an antenna port; a signal port for transmitting and receiving signals in the first band; and a plurality of resonators configured to couple the signal port to the antenna port as part of a transmission path; and means for generating a resonance outside of the first band and a second band of the multi-band system, the resonance being closer to the second band than to the first band.

In another illustrative example, a method of filtering a signal in a wireless communication apparatus for a multi-band system is provided. The method comprises: receiving the signal at a frequency band filter circuit having a filter passband that includes a first band of the multi-band system, the frequency band filter circuit comprising a plurality of resonators coupled between an antenna port and a signal port and a resonant structure electrically coupled to the plurality of resonators; and filtering the signal using the frequency band filter circuit, wherein filtering is configured with a resonance outside of the first band and a second band of the multi-band system, the resonance being closer to the second band than to the first band.

In another illustrative example, a wireless communication apparatus for a multi-band system is provided. The apparatus comprises: a frequency band filter circuit for a first band of the multi-band system, the frequency band filter circuit comprising: an antenna port; a signal port for transmitting and receiving signals in the first band; and a plurality of resonators configured to couple the signal port to the antenna port, wherein a resonant structure of the plurality of resonators has a resonance outside of the first band and a second band of the multi-band system, the resonance being centered at a frequency greater than a threshold range outside of the first band.

In another illustrative example, a wireless communication device for a multi-band system is provided. The wireless communication device comprises: a plurality of frequency band filter circuits; a multiplexer configured to multiplex signals between the plurality of frequency band filter circuits and one or more antennas; processing circuitry coupled to the plurality of frequency band filter circuits; and a first frequency band filter circuit of the plurality of frequency band filter circuits having a passband including a first frequency band, the first frequency band filter circuit comprising: a plurality of resonators coupled between the multiplexer and a filter input port; and a resonant structure electrically coupled to the plurality of resonators, wherein the resonant structure has a resonance outside of the first frequency band and a second frequency band of the multi-band system, the resonance being closer to the second frequency band than to the first frequency band, and wherein the second frequency band is associated with a second frequency band filter circuit of the plurality of frequency band filter circuits.

In a further illustrative example, a wireless communication apparatus for a multi-band system is provided. The wireless communication apparatus comprises: a frequency band filter circuit having a filter passband that includes a first band of the multi-band system, the frequency band filter circuit comprising: a plurality of resonators coupled between an antenna port and a signal port; and a resonant structure electrically coupled to the plurality of resonators, wherein the resonant structure has a resonance outside of the first band and a second band of the multi-band system, the resonance being closer to the second band than to the first band.

In some aspects, the multi-band system comprises the first band, the second band, and a third band between the first band and the second band, and wherein the resonance of the resonant structure is at a frequency between the third band and the second band.

In some aspects, a device or apparatus further includes a plurality of frequency band filter circuits comprising the frequency band filter circuit for the first band, a frequency band filter circuit for the second band, and a frequency band filter circuit for a third band.

In some aspects, the plurality of frequency band filter circuits comprise micro-electroacoustic filters implemented as surface acoustic wave devices.

In some aspects, the plurality of frequency band filter circuits comprise micro-electroacoustic filters implemented as bulk acoustic wave devices.

In some aspects, the resonant structure reduces a phase angle of an antenna reflection coefficient in the second band.

In some aspects, the resonant structure comprises: an input coupled to the signal port via the plurality of resonators other than the resonant structure; an output coupled to the antenna port; a first resonator having a first terminal coupled to the input, the first resonator having a second terminal coupled to the output; and a second resonator having a first terminal coupled to the first terminal of the first resonator, the second resonator having a second terminal coupled to a ground.

In some aspects, the first band is from 2110 Megahertz (MHz) to 2170 MHz. In some aspects, a second band is 2300 MHz to 2400 MHz.

In some aspects, the resonant structure is implemented in a shared substrate with the frequency band filter circuit.

In some aspects, the resonant structure is implemented using surface mount components coupled to a substrate for the frequency band filter circuit.

In some aspects, the resonant structure is implemented at least partially in a laminate carrier coupled to a substrate for the frequency band filter circuit.

In some aspects, the apparatus comprises an antenna coupled to the antenna port; and processing circuitry coupled to the signal port.

In some aspects, the apparatuses described above can include a mobile device with a camera for capturing one or more pictures. In some aspects, the apparatuses described above can include a display for displaying one or more pictures. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

FIG. 10C is a schematic diagram of a resonant structure that may be used with an electroacoustic filter circuit in accordance with examples described herein.

DETAILED DESCRIPTION

Figures 1A, 1B:
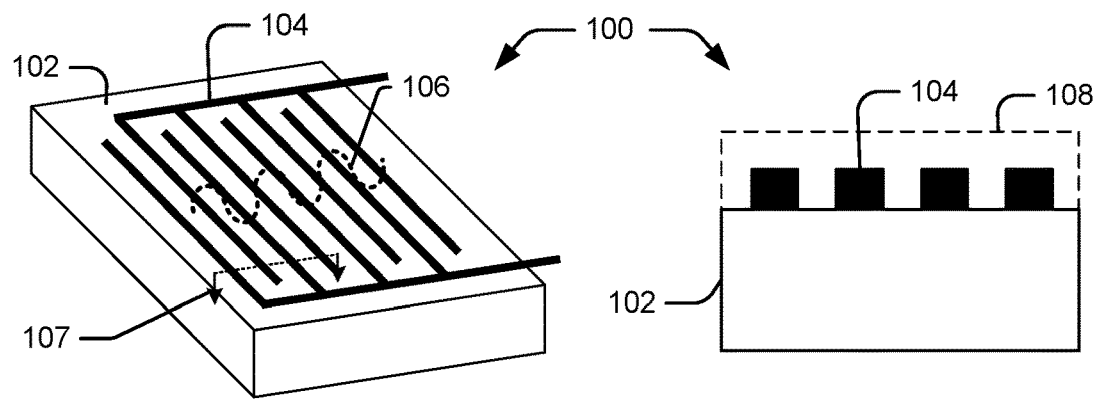
FIG. 1A is a diagram of a perspective view of an example of an electroacoustic device.
FIG. 1B is a diagram of a side view of the electroacoustic device of FIG. 1A.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices such as surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance. In general, certain SAW resonators are designed to cause propagation of an acoustic wave in a particular direction through the piezoelectric material (e.g., main acoustic wave mode). However, due to the nature of the particular piezoelectric material used and the way the piezoelectric material is excited by the electrode structure, at least some undesired acoustic wave modes in other directions may be generated. For example, transversal acoustic wave modes that are transverse to the direction of the main (e.g., fundamental) acoustic wave mode may be excited in the piezoelectric material. These transversal acoustic wave modes may be undesirable and have an adverse impact on filter performance (e.g., introducing ripples in the passband of the filter). By adjusting characteristics of the electrode structure, acoustic velocities in various transversal regions may be controlled in a manner to reduce transversal acoustic wave modes. The characteristics that are adjusted may depend on the type of piezoelectric material and other characteristics of the SAW resonator.

In addition to the SAW devices described herein, other resonators can be used in RF filters in accordance with the examples described herein. For example, bulk acoustic wave (BAW) or think-film bulk acoustic resonator (FBAR or TFBAR) devices include a piezoelectric material manufactured with thin films sandwiched between two electrodes and isolated from vibrations in a surrounding substrate. The piezoelectric films of such devices can have thicknesses in the range of several micrometers down to fractions of a micrometer, and can resonate in frequency ranges above 100 Megahertz (MHz). As described herein, SAW, BAW, and other devices can be referred to as resonators or electroacoustic resonators. Aspects of the present disclosure are directed to radio frequency (RF) filters for filtering a signal for a particular frequency or range of frequencies, particularly in a multi-band context, where multiple filters can be used to send signals to a shared antenna. Aspects of the present disclosure use resonant structures added to RF filters to modify the phase characteristics of the antenna reflection coefficients for the filters to reduce the interactions that different (e.g., counter) band-signals have with the particular filter, and thereby improve communication performance.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
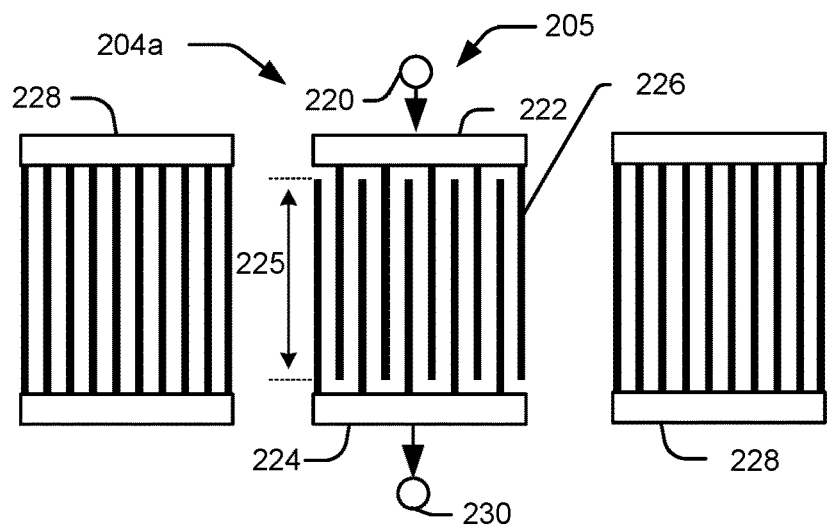
FIG. 2A is a diagram of a top view of an example of an electrode structure of an electroacoustic device.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars, there is an overlap region including a central region where a portion of one finger overlaps with a portion of an adjacent finger as illustrated by the central region 225. This central region 225 including the overlap may be referred to as the aperture, track, or active region where electric fields are produced between fingers 226 to cause an acoustic wave to propagate in this region of the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. This distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
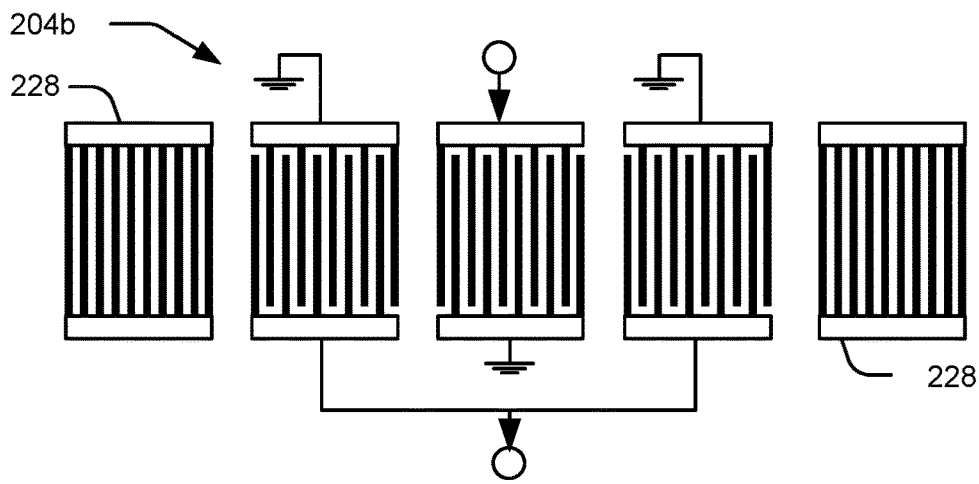
FIG. 2B is a diagram of a top view of another example of an electrode structure of an electroacoustic device.

FIG. 2B is a diagram of a top view of another example of an electrode structure 204b of an electroacoustic device 100. In this case, a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 3A:
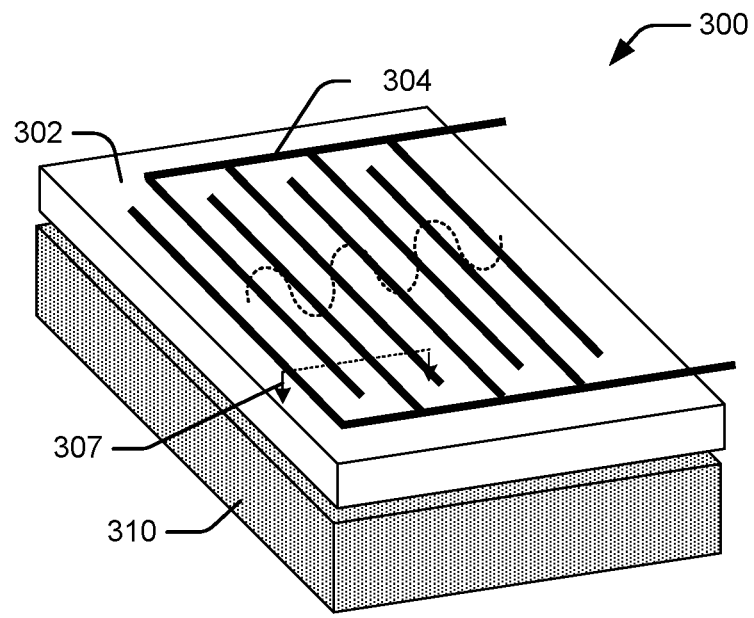
FIG. 3A is a diagram of a perspective view of another example of an electroacoustic device.

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3 may be Lithium niobite (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
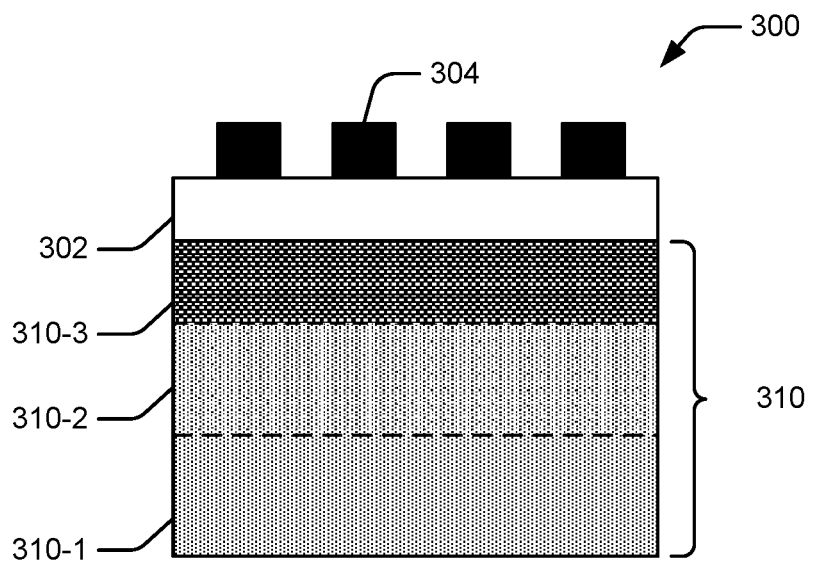
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer (e.g., silicon dioxide (SiO2) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
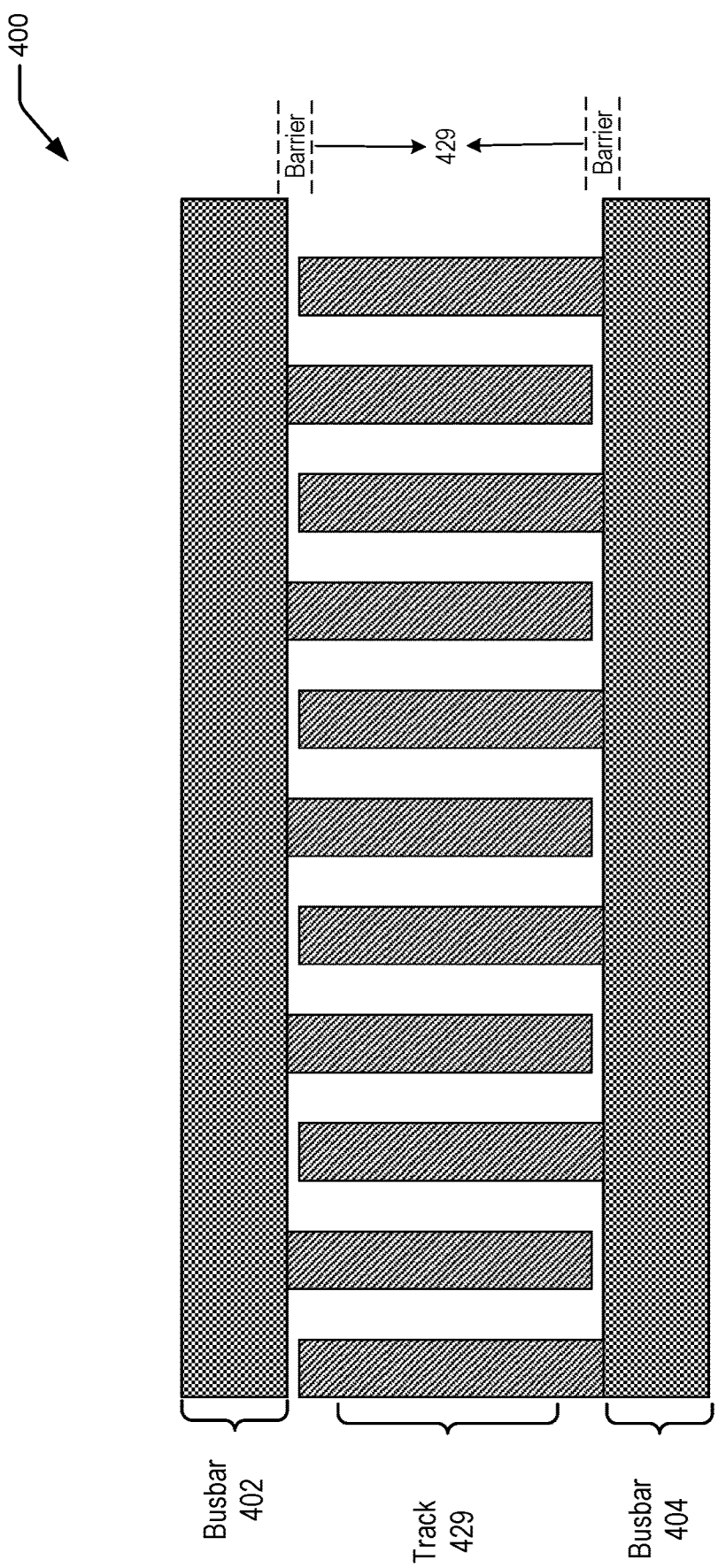
FIG. 4 is a diagram of a view of an electroacoustic device that can be used in accordance with examples described herein.

FIG. 4 is a diagram of a view of an electrode structure 400 a resonator in accordance with some examples. Just as above, the electrode structure 400 may be referred to as an IDT that can be fabricated on the surface of a piezoelectric material as part of a resonator. The electrode structure 400 includes first and second comb shaped electrodes. The comb teeth are within track 429, and supported by busbar 402 on one side and busbar 404 on the other side. An electrical signal excited on one side of the electrode structure is transformed into an acoustic wave that propagates in a particular direction via the piezoelectric material that electrode structure 400 is fabricated on. The acoustic wave is transformed back into an electrical signal and provided as an output.

Figure 5A:
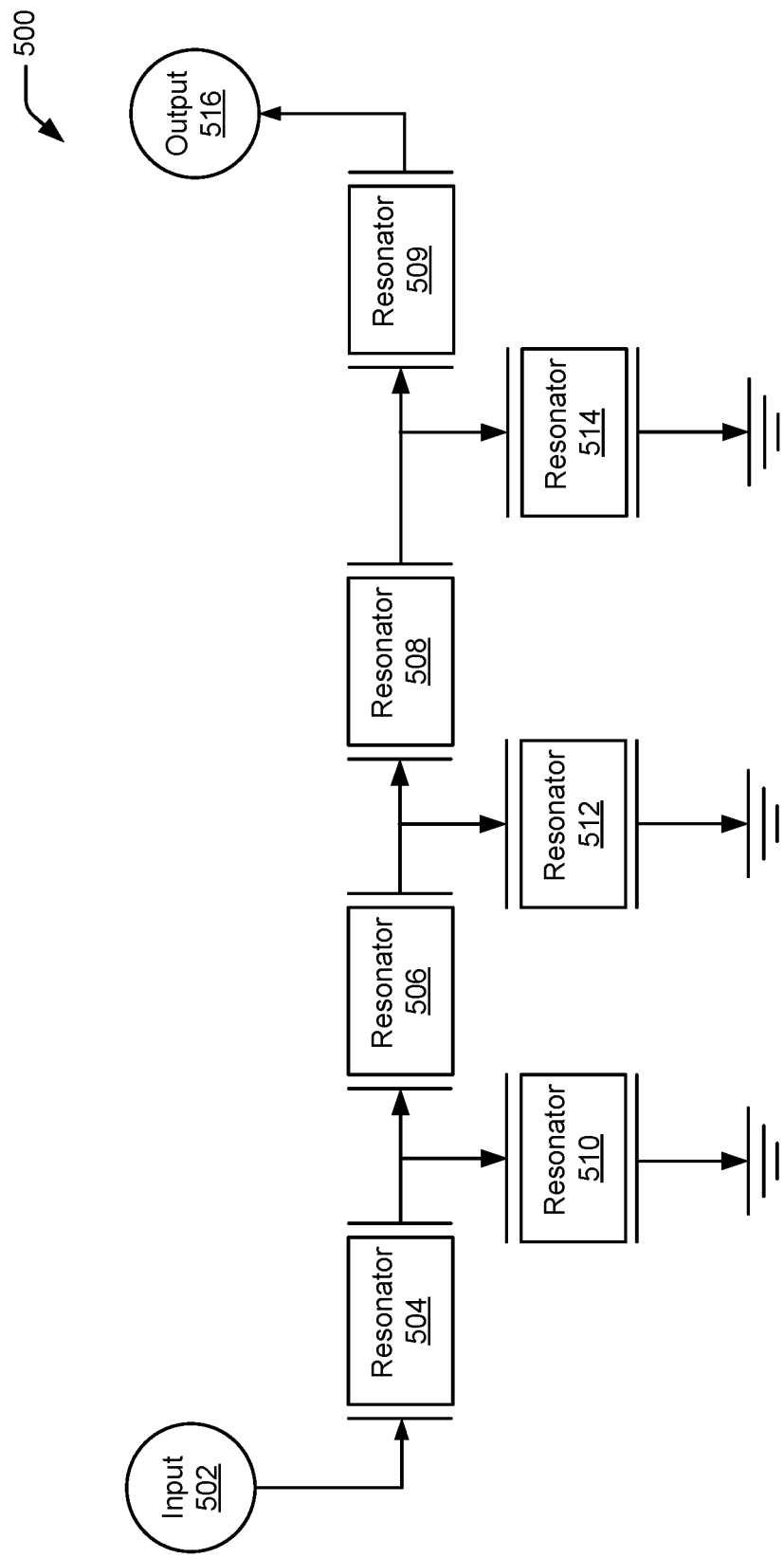
FIG. 5A is a schematic representation of aspects of a filter in accordance with examples described herein.

FIG. 5 is a schematic diagram of an electroacoustic filter circuit 500 that may have a resonant structure added in accordance with the examples described herein. The example of FIG. 5 includes a ladder structure. In other examples, other structures can be used. The filter circuit 500 provides one example of where the additional resonant structure may be used to improve filter performance in a multi-band environment by modifying the phase characteristics of the reflection coefficient (e.g., the parameter or coefficient for reflection at output 516, as opposed to the transmission parameters from input 502 to output 516 and output 516 to input 502, or the reflection coefficient at input 502). The filter circuit 500 includes an input 502 and an output 516. Between the input 502 and the output 516 a ladder network of resonators is provided. The resonators can be SAW resonators or any other such resonator device as detailed herein (e.g., BAW etc.). The filter circuit 500 includes a first resonator 504, a second resonator 506, a third resonator 508, and a fourth resonator 509 all electrically connected in series between the input 502 and the output 516. A fifth resonator 510 (e.g., a shunt resonator) has a first terminal connected between the first resonator 504 and the second resonator 506 and a second terminal connected to a ground potential. A sixth resonator 512 (e.g., shunt resonator) has a first terminal connected between the second resonator 506 and the third resonator 508 and a second terminal connected to a ground potential. Seventh resonator 514 similarly has a first terminal connected between third resonator 508 and fourth resonator 509, and a second terminal connected to a ground potential (e.g., either directly or using additional circuitry, such as an inductor or other connecting circuitry coupled to the ground potential). The electroacoustic filter circuit 500 may, for example, be a band pass circuit having a passband within a selected frequency range (e.g., on the order between 100 MHz and 3.5 GHz). In some examples, filter circuit 500 can be integrated with an additional resonant structure as detailed below (e.g., in FIGS. 6A, 6B, 10A, 10B, 10C, 10D, etc.) to improve communication performance in a multi-band communication environment by using the additional resonant structure to modify phase characteristics of the filter circuit 500 or other similar filter circuits.

Figure 5B:
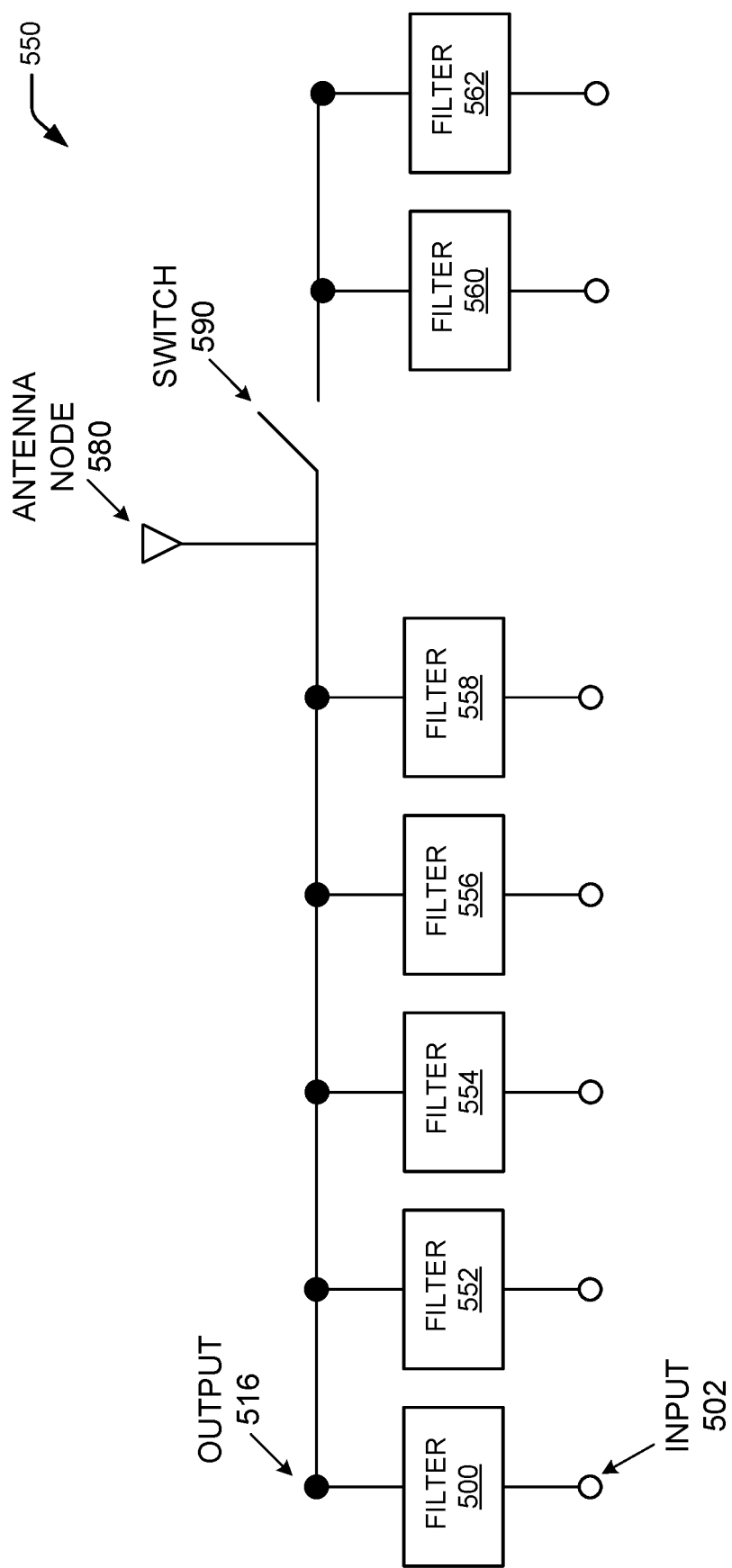
FIG. 5B is a schematic representation of a multiplexer with multiple filters configured for multi-band communications.

FIG. 5B is a schematic representation of a multiplexer circuit 550 with multiple filters configured for multi-band communications using antenna node 580. The filters include filter circuit 500 from FIG. 5A, including output 516 and input 502. Additional filters 552, 554, 556, 558, 560, and 562 are shown, which can be used for corresponding bands of the multi-band communications. Other examples can include multiplexing with any number of filters. Switch 590 can isolate filters 560 and 562 from the remaining filters when the frequency bands associated with filters 560 and 562 are not in use. Isolating filters 560 and 562 can improve the communication performance of multiplexer circuit 550 by limiting interference by filters 560 and 562 with signals from filters (or filter circuits) 500-558 when filters 560 and 562 are not in use (e.g., signal loss due to leakage into filters 560 and 562 is limited when filters 560 and 562 are disconnected by the switch). Other examples may include additional switches to create additional groupings of filters that can be isolated by the switches. Further examples may include no switches, so that all of the filters can be hard-wired at an antenna node as part of the multiplexer circuitry.

Since the introduction of carrier aggregation in 3GPP Rel. 10, the number of possible band combinations has increased significantly. For inter-band non-contiguous carrier aggregation, RF front-end solutions face significant challenges because many band select filters, which can be realized as micro-electroacoustic filters in surface acoustic wave or bulk acoustic wave technology, are electrically combined at a common antenna node using a multiplexer such as multiplexer circuit 550 illustrated in FIG. 5B. Such electrical combinations can be switchable in front-end architectures, to be able to choose between different band combinations. For example, a [Band 1+Band 3+Band 40] multiplexer as defined for 3GPP cellular communications can be implemented in designs that are structured to have these set bands working in stand-alone operation as well as with a combined Band 7 duplexer to enable a [Band 1+Band 3+Band 40+Band 7]-multiplexer. Multiplexer circuit 550 of FIG. 5B can illustrate such a multiplexer when filter circuit 500 is associated with Band 3 transmissions, filter 552 is associated with Band 3 signal reception, filter 554 is associated with Band 1 transmissions, filter 556 is associated with Band 1 reception, filter 558 is associated with Band 40 transmission and reception, filter 560 is associated with Band 7 transmission, and filter 562 is associated with Band 7 reception. Switch 590 can be used in an open position for the independent [Band 1+Band 3+Band 40] operation, and when switch 590 is in a closed position, combined [Band 1+Band 3+Band 40+Band 7]-multiplexer operations allow all seven bands to be used at one time. Such complex operating states with multiple band configurations create performance and space concerns for wireless communication devices.

In multiplexing (e.g., the combination of different frequency band filters on a common antenna node), the antenna impedance of one multiplexed filter will ideally show an open-circuit (e.g., for magnitude |F| and phase p of the reflection coefficient F at the antenna node) for the frequency range of the respective counter bands. For the example above, a Band 7 filter will ideally show an open-circuit at the antenna node in the Band 3, Band 1 and Band 40 frequency ranges. Similarly, the filter combination for Band 3, Band 1, and Band 40 will ideally show an open-circuit in the Band 7 frequency range. The best performance of a multiplexer in terms of losses and the ability to switch between different operating states without performance degradation, would be achieved if the open-circuit condition (e.g., |F|=1, p=0 degrees) is perfectly fulfilled for all counter band frequencies. The open-circuit condition (e.g., |F|=1, p=0 degrees) is represented in Smith chart form as the right-most point in the illustrated charts of FIGS. 8 and 9 (e.g., open circuit condition 810 as described in more detail below). As described, these ideal circumstances are not possible over a band frequency range in actual physical implementations of the different filters. Real world physical systems are always subject to losses and are dispersive. The magnitude of the reflection coefficient of a real filter is always less than one. Additionally, the phase angle of the reflection coefficient is frequency-dependent, such that a phase spread is observed over a frequency range. Additional details of such phase spread is particularly discussed below with respect to FIG. 7, FIG. 8, and FIG. 9.

As a part of the phase spread over a band frequency range, the more the perfect open-circuit condition is violated (e.g., the further the magnitude is from 1 and the further the phase angle is from 0 degrees), the more power leaks between multiplexed filters via the antenna node. The power leakage results in increased losses for the filters in the multiplexer configuration (e.g., multiplexer circuit 550). These multiplexing losses significantly increase the more the phase angle of the reflection coefficient deviates from zero degrees. Furthermore, the magnitude of loss escalates quickly for phase angles less than negative 90 degrees or more than positive 90 degrees. When several frequency bands are combined in a multiplexer, the perfect open-circuit condition in terms of phase angle can only be fulfilled for a single frequency point. Consequently, additional losses are introduced for frequencies below and above that frequency point. Examples described herein modify the phase characteristics of filter circuits to reduce the losses described above. The reduction of these multiplexing losses allows improved device performance, and for some communication standards, allows a device to meet standards based performance metrics using limited physical resources and physical space. RF front-end modules for devices that include filter circuits in accordance with the examples described herein can thus provide improved communication performance.

Figure 6A:
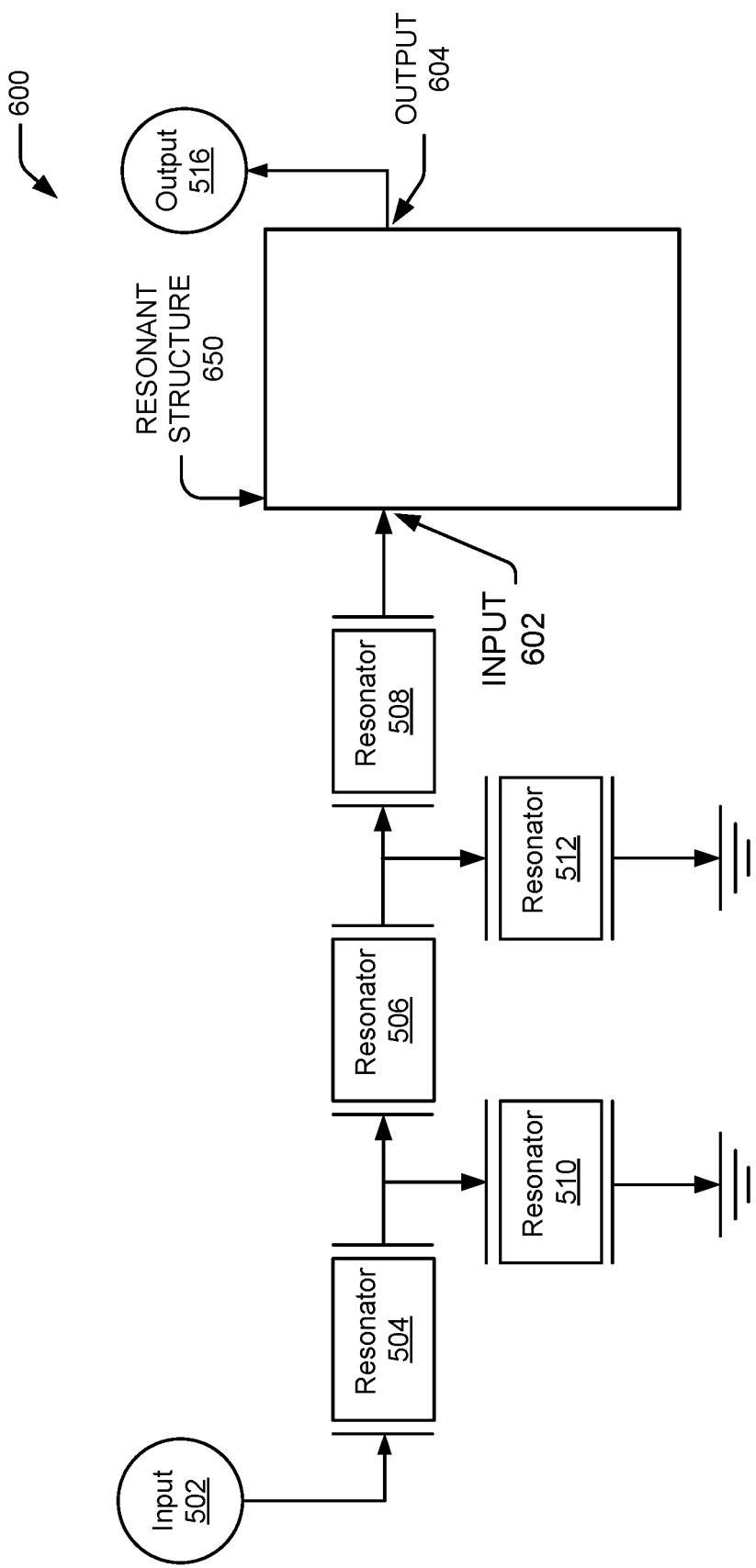
FIG. 6A is a schematic representation of aspects of a filter in accordance with examples described herein.

FIG. 6A is a schematic representation of aspects of a filter circuit 600 in accordance with examples described herein. Filter circuit 600 can be used as any filter of multiplexer circuit 550. Different filters with different values for the resonators 504, 506, 508, 510 and 512 can be matched to particular communication bands supported by multiplexer circuit 550. For example, one implementation of filter circuit 600 with one set of values can be used as filter 560, and another implementation of filter circuit 600 with different values for the resonators can be used as filter 552, with each filter supporting a different communication band of a multi-band system. Filter circuit 600 can also be used with other filter or resonant structures, including any resonant structure described herein (e.g., the filters of FIGS. 10A-10D).

Filter circuit 600 includes input 502 and output 516, just as structured for filter circuit 500. Filter circuit 600 also includes resonator 504, resonator 506, resonator 508, resonator 510, and resonator 512, configured just as described above for filter circuit 500. Filter circuit 600, however, includes resonant structure 650, which can include the final ladder step of filter circuit 500 with one or more added elements (e.g., resonators). Other examples can place the added resonant structure in a different position, such as a position separated from output 516 via one or more additional filtering or signal conditioning structures. In some such examples, the resonant structure(s) are placed in the circuit in a way that influence or manipulate the antenna reflection coefficient. Resonant structure 650 includes an input 602 that is coupled to the output (e.g., second) terminal of resonator 508. Resonant structure 650 also has an output 604 that connects to output 516. Resonant structure 650 is configured in a position close to output 516 to limit propagation of reflections down the circuit ladder of resonators 504-512.

Filter circuit 600 can be used in a wireless communication apparatus (e.g., multiplexed with other filters) for a multi-band system as described in accordance with examples herein. In accordance with some examples described herein, filter circuit 600 operates as a frequency band filter circuit for a first band of the multi-band system, with the frequency band filter circuit comprising an antenna port (e.g., output 516), a signal port for transmitting and/or receiving signals in the first band (e.g., input 502), and a plurality of resonators (e.g., resonators 504, 506, 508, 510, and 512) configured to couple the signal port to the antenna port as part of a transmission path. The wireless communication apparatus also includes a resonant structure 650 electrically coupled to the plurality of resonators in the transmission path. The particular structure of the resonant structure can vary across different examples. For example, as described above in FIG. 5B, a multiplexer circuit such as multiplexer circuit 550 can be configured with filters for a multi-band system with at least the first band and a second band. In some examples, the resonant structure has a resonance outside of the first band and the second band of the multi-band system, with the resonance set closer to the second band than to the first band. In other examples, the resonant structure is defined by a resonance being centered at a frequency greater than a threshold range outside of the first band. Additional details of some such examples with multiple bands and a resonance closer to the second band than the first band are described further below, particularly with respect to FIG. 7.

As described above, the resonant structure 650 (e.g., including one or more additional resonators or other resonant structures) is electrically connected to the filter signal path. In different examples, resonant structure 650 or components that make up resonant structure 650 can be placed in different configurations as part of a device. In some examples, resonant structure 650 is placed directly in the signal propagation path of the electroacoustic filter (e.g., in a shared piezoelectric substrate). In some examples, resonant structure 650 is placed as part of components in the surroundings of an electroacoustic filter (e.g., in or around a laminate carrier that an electroacoustic filter is assembled with). In some examples, resonant structure 650 can be created as a combination of the two options above.

Figure 6B:
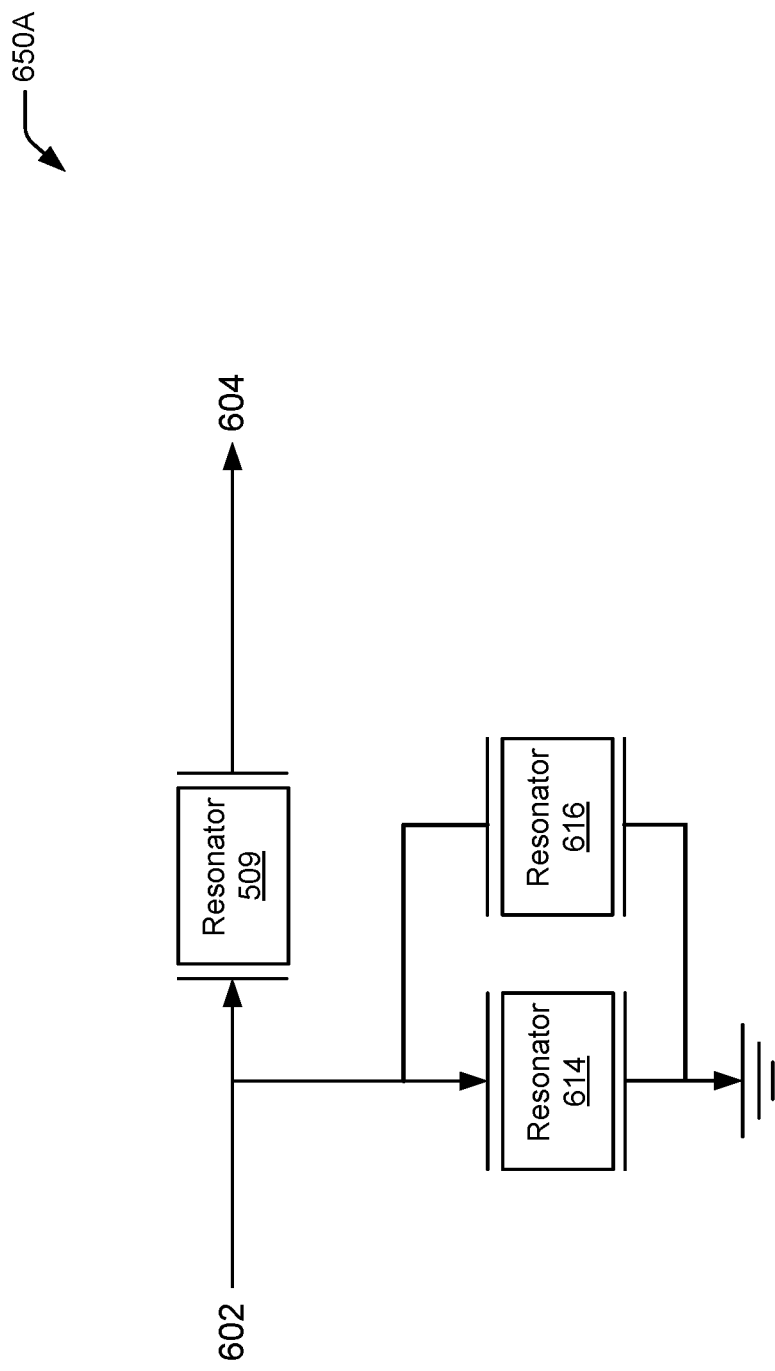
FIG. 6B is a schematic representation of a resonant structure for use with in an electrical signal path of a filter in accordance with examples described herein.

FIG. 6B is a schematic representation of a resonant structure 650A for use with in an electrical signal path of a filter in accordance with examples described herein. Other resonant structures 650B-E are described below. Different resonant structures are possible within the scope of the descriptions provided herein. Resonant structure 650A includes input 602 and output 604 as described above in FIG. 6A and associated resonant structure 650. The particular resonant structure 650A of FIG. 6B additionally includes the resonator 509 described as part the final ladder of filter circuit 500 in FIG. 5A. Resonant structure 650A additionally includes resonator 614 and resonator 616 in parallel. Resonators 614 and 616 can be designed by splitting the resonator 514 from the design of filter circuit 500 into two resonators, and detuning one of the resonators (e.g., resonator 616) to create an additional resonance specifically selected to modify the phase angle of the antenna reflection coefficient for a filter including resonant structure 650A. In some examples, the additional resonance is outside of the passband for the associated filter circuit. In some examples, the additional resonance is closer to a second passband than to the passband for the associated filter circuit, while being outside of both passbands. If there are additional passbands, the additional resonance can be configured to be outside of all passbands of the multi-band system.

In resonant structure 650A, resonator 614 is connected in the same way as resonator 514 is connected in filter circuit 500. Resonator 616 of resonant structure 650A was added to the design and includes a first terminal connected to the first terminal of resonator 614 (e.g., between resonator 614 and resonator 509) and a second terminal coupled to the second terminal of resonator 614 (e.g., to the ground connected to resonator 614). The addition of resonator 616 creates an additional resonance which, as described above, is used in accordance with examples described herein to modify antenna phase characteristics of the filter circuit that the resonant structure 650A is part of. The value of resonator 616 is used to define an additional resonance (e.g., additional resonance 722) that is used to modify the antenna phase characteristics. The additional resonators define other characteristics, such as a filter passband (e.g., resonators 509 and 616), and the combination of all of the resonators results in antenna phase characteristics for improved performance of a communication device in accordance with examples described herein. In some examples, the de-tuned resonator (e.g., resonator 616) is selected by de-tuning the finger period to shift the resonance frequency and position of the resonance frequency above or below a counter band frequency (e.g., outside of any frequency band in a multi-band system) in accordance with resonance selection limitations described herein. These resonance selection limitations can include the resonance being centered about a selected frequency more than a threshold range away from the band associated with a particular filter. These resonance selection limitations can include the resonance being centered about a selected frequency closer to a counter band than to the communication band associated with a filter circuit (e.g., closer to a second band than to a first band). In other examples, other resonance selection limitations can be used to modify the phase characteristics of a filter circuit to improve communication performance as described herein.

Figure 7:
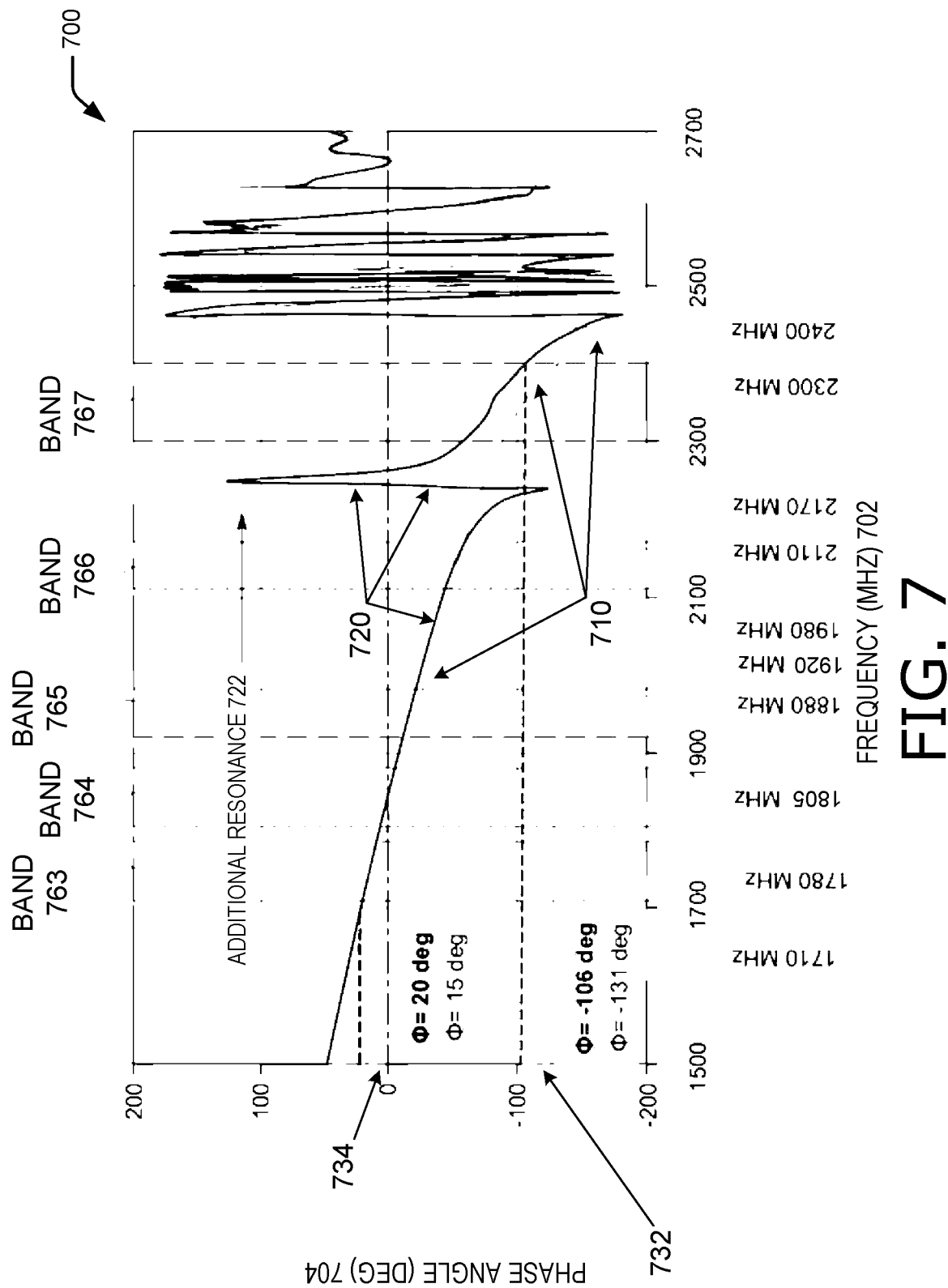
FIG. 7 is a graph illustrating phase angles of an antenna reflection coefficient for a filter with and without an additional resonant structure over a frequency range including multiple communication bands in accordance with examples described herein.

FIG. 7 is a graph 700 illustrating phase angles of an antenna reflection coefficient for a filter with (e.g., phase angles 720) and without (e.g., phase angles 710) an additional resonant structure (e.g., resonant structure 650) over a frequency range including multiple communication bands in accordance with examples described herein. FIG. 7 particularly illustrates an additional resonance 722 generated by a resonant structure such as resonant structure 650 described above which is used to improve device performance in accordance with examples described herein. Graph 700 shows a chart of phase angle values 704 against a frequency range 702 from 1500 MHz to 2700 MHz containing five bands, shown as band 763, band 764, band 765, band 766, and band 767. In one example, band 763 is a frequency band from 1710 MHz to 1780 MHz (e.g., Band 3 transmission), band 764 is a frequency band from 1805 MHz to 1870 MHz (e.g., Band 3 reception), band 765 is a frequency band from 1920 MHz to 1980 MHz (e.g., Band 1 transmission), band 766 is a frequency band from 2110 MHz to 2170 MHz (e.g., Band 1 reception), and band 767 is a frequency band from 2300 MHz to 2400 MHz (e.g., Band 40 transmission and reception). Each of these bands can be associated with a corresponding filter multiplexed together, as described above for multiplexer circuit 550 (e.g., including filters 500, 552, 554, 556, and 558). These bands 763-767 are the counter bands for an additional frequency band (e.g., Band 7, which is not shown) associated with the filter. The illustrated phase angles 710 and 720 illustrate phase angles over the frequency range 702 for the filter associated with signals being communicated on the additional band (which is not shown). As described above, the phase angle of the antenna reflection coefficient across all of the communication bands 763 through 767 for a filter impacts performance for those bands in a communication device.

For phase angles 710 associated with a filter circuit without the additional resonant structure, the worst phase angle value for performance occurs at the high frequency end of band 767, where the phase angle is approximately negative 131 degrees. As described above, phase angles below negative 90 degrees have a highly negative impact on performance. The additional resonance 722 added by a resonance structure (e.g., resonance structure 650), as shown by the difference between phase angles 710 and 720, adds a significant phase angle spike. The spike, however, occurs outside of any of the communication bands (e.g., between bands 767 and 766) for a communication apparatus that includes the filter (e.g., electronic device 1202 or a device with a transceiver circuit 1100) having a resonant structure as described herein.

The additional resonance 722 creates a modification 732 of the phase angle over the range of band 767 in a positive direction, so the worst phase angle value for performance of phase angles 720 (e.g., associated with the filter having the resonant structure) is now shifted as part of modification 732 to be approximately negative 106 degrees instead of negative 131 degrees in phase angles 710. The modification 732 from negative 131 degrees to negative 106 degrees is associated with improved device performance. In band 763, the phase angle associated with the worst performance degrades slightly with a modification 734 from approximately positive 15 degrees to positive 20 degrees. The improvement in band 767 associated with modification 732, however, can provide significant performance improvement at a very minor cost to the performance in band 763 from modification 734. The overall impact of the modifications to the phase angles illustrated provides a significant performance improvement.

The alternating phase jumps above band 767 originate from the acoustic resonances of resonators in the filter(s) being modified with the resonant structure (e.g., for which bands 763-767 are counter bands). Changes in these frequency ranges do not negatively impact performance.

Figure 8:
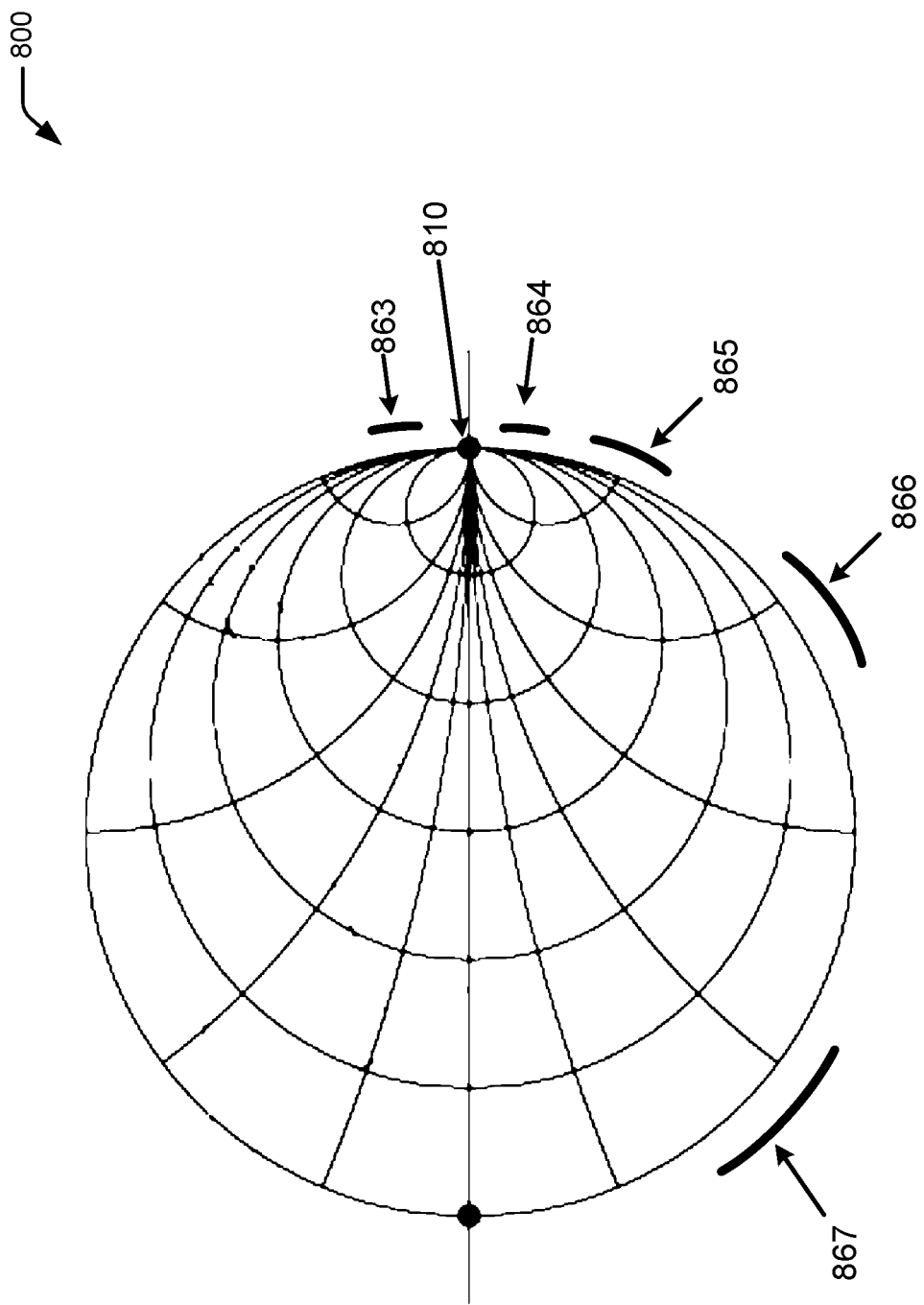
FIG. 8 is a Smith chart representing phase angles of the antenna reflection coefficient of one communication band in the frequency range of other communication bands that are part of a multiplexer without an added resonant structure in the signal path in accordance with examples described herein.

FIG. 8 is a Smith chart 800 representing phase angle ranges in communication band frequencies for an antenna reflection coefficient in a filter without an added resonant structure in the signal path. As described above, open circuit condition 810 is at the rightmost point in the illustrated Smith chart 800. The open circuit condition 810 represents the ideal view for each counter band looking into a filter, but can only be achieved at a single frequency, not a frequency range associated with communication bands. Instead, chart lines 863, 864, 865, 866, and 867 show phase angle values associated with particular frequency bands. The chart lines are shown outside the magnitude 1 circle of the illustrated Smith chart 800 for the purpose of clarity to show the phase angle ranges, but in an actual representation of reflection coefficient of a physical device, the lines would be inside the illustrated Smith chart to accurately represent the performance of a filter circuit. Chart line 863 can represent the phase angles in band 763 of phase angles 710. The worst phase angle of phase angles 710 at the higher frequency end of band 763 is represented by the left-most side of chart line 867, and the phase angles decrease across the frequency band 763 to the low frequency end of frequency band 763, where the phase angle at the low frequency side of frequency band 763 would be represented by the right most side of chart line 867. Each of chart lines 863, 864, 865, and 866 would reflect the phase angles for the other corresponding frequency bands. Just as for phase angles 710, the chart lines of FIG. 8 are associated with a filter circuit without a resonant structure.

Figure 9:
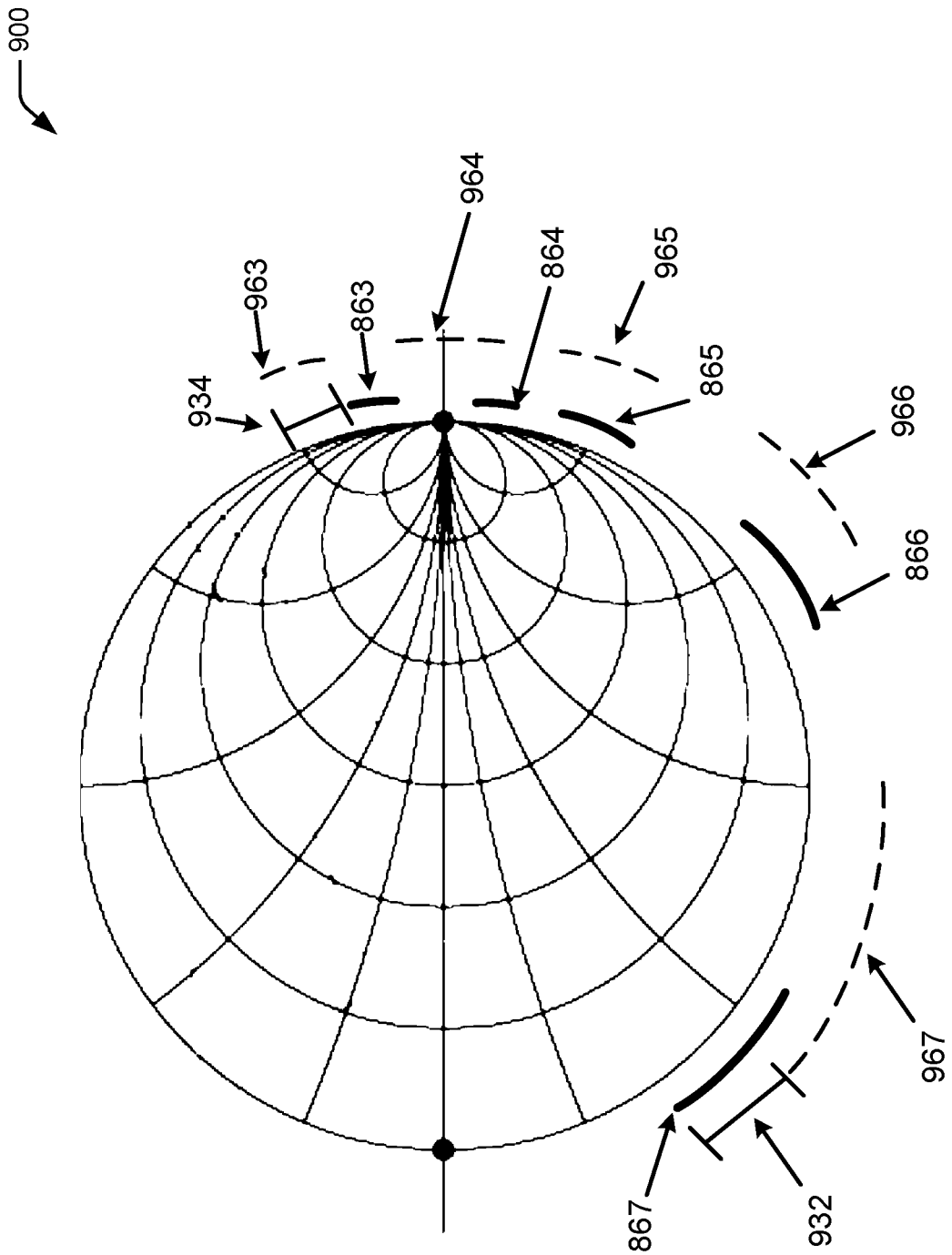
FIG. 9 is a Smith chart representing the phase angles of FIG. 8 with changes associated with addition of a resonant structure to a filter in accordance with examples described herein.

FIG. 9 is a Smith chart 900 representing phase angle range changes (e.g., modifications 732 and 734) for an antenna reflection coefficient associated with addition of a resonant structure to a filter in accordance with examples described herein. FIG. 9 represents modification of the filter circuit represented by FIG. 8, with the resonant structure causing phase modification 932 and phase modification 934. The chart lines in FIGS. 8 and 9 are not necessarily proportional, but represent the modification of phase angles (and not the reflection coefficient magnitude) due to resonant structures to illustrate examples described herein.

FIG. 9 shows chart lines 863-867, which are the same in FIG. 9 as in Smith chart 800 of FIG. 8. FIG. 9 additionally includes chart lines 963, 964, 965, 966, and 967, which represent the phase angles of the antenna reflection coefficient for a circuit with a resonant structure in frequency ranges for counter bands, similar to phase angles 720 of FIG. 7 (e.g., frequency ranges between the counter bands are excluded from the Smith chart). These chart lines correspond to the chart lines of FIG. 8, with chart line 963 corresponding to chart line 863, chart line 967 corresponding to chart line 867, and each of the other chart lines having a corresponding chart line in FIGS. 8 and 9. The differing positions between the corresponding chart lines of FIGS. 8 and 9 show the phase modification caused by inclusion of a resonant structure (e.g., resonant structure 650) as illustrated by FIG. 7. As illustrated by FIG. 9 the addition of the resonant structure causes the phase values for a given band to shift in a clockwise direction around the Smith chart by almost a full rotation to result in the described shift and an overall compression in the range of phase values. Just as described above for phase angles 720 and modifications 732 and 734, modification 932 decreases the worst phase angle value, improving the communication performance of a filter (e.g., a Band 7 filter with illustrated reflection coefficient phase angles for the counter bands shown in FIG. 9) modified with a resonant structure having a resonance outside the band frequencies of the multi-band system. Also similar to modification 734 of FIG. 7, modification 934 worsens the phase angles for chart line 963, increasing the associated phase values as the resonant structure shifts the phase angle values counterclockwise In one example, the filter represented by FIG. 8 and FIG. 9 can be a Band 7 filter, as described in other examples above, with the reflection coefficient phase values for counter bands (e.g., Band 1, Band 3, and Band 40 ranges) shown. Smith charts 800 and 900 in such an example show phase angles of the antenna reflection coefficient of two Band 7 duplexers at the frequency ranges of the counter bands (e.g., Band 3, Band 1, Band 40) to which the Band 7 duplexer is combined in a [Band 3+Band 1+Band 40+Band 7]-multiplexer. The chart lines of FIG. 8 show the counter band reflection coefficient phase angle data for Band 7 filter(s) (e.g., a duplexer) without a resonant structure in accordance with examples described herein. The modifications and new chart lines included only in FIG. 9 show phase angle data and modifications when a resonant structure is added to a Band 7 filter(s) in accordance with examples described herein (e.g., resonant structures 650, 650A-E, etc.) As described above, the modifications illustrated by FIG. 9 can be associated with a resonant structure designed using a split shunt resonator (e.g., resonator 616) with a de-tuned finger period that generates an additional resonance (e.g., additional resonance 722) above a Band 1 Rx frequency range and below a Band 40 frequency range. The other resonator as part of the split resonator can stay as is following the split to form the filter passband of the filter that contains the resonant structure. In addition to reducing the worst case phase angles for the Band 40 range, the total phase range from the worst case of the Band 40 range (e.g., chart line 867) to the worst case of the Band 3 range (e.g., for chart line 863) is approximately 126 degrees with the added resonant structure. As illustrated, the phase angle ranges are also compressed, so that the total phase range after the modification using the resonant structure is reduced (e.g., from 146 degrees to 126 degrees). In one example, the reduction can be 20 degrees with respect to the reference design, as illustrated by modifications 734 and 932, and 934, further improving communication device performance. In other designs, other changes can be implemented to compress the total phase angle difference in the bands of the multi-band communication device, in addition to improving performance for particular bands (e.g., in band 767 as illustrated by modification 732 and modification 932).

Figure 10A:
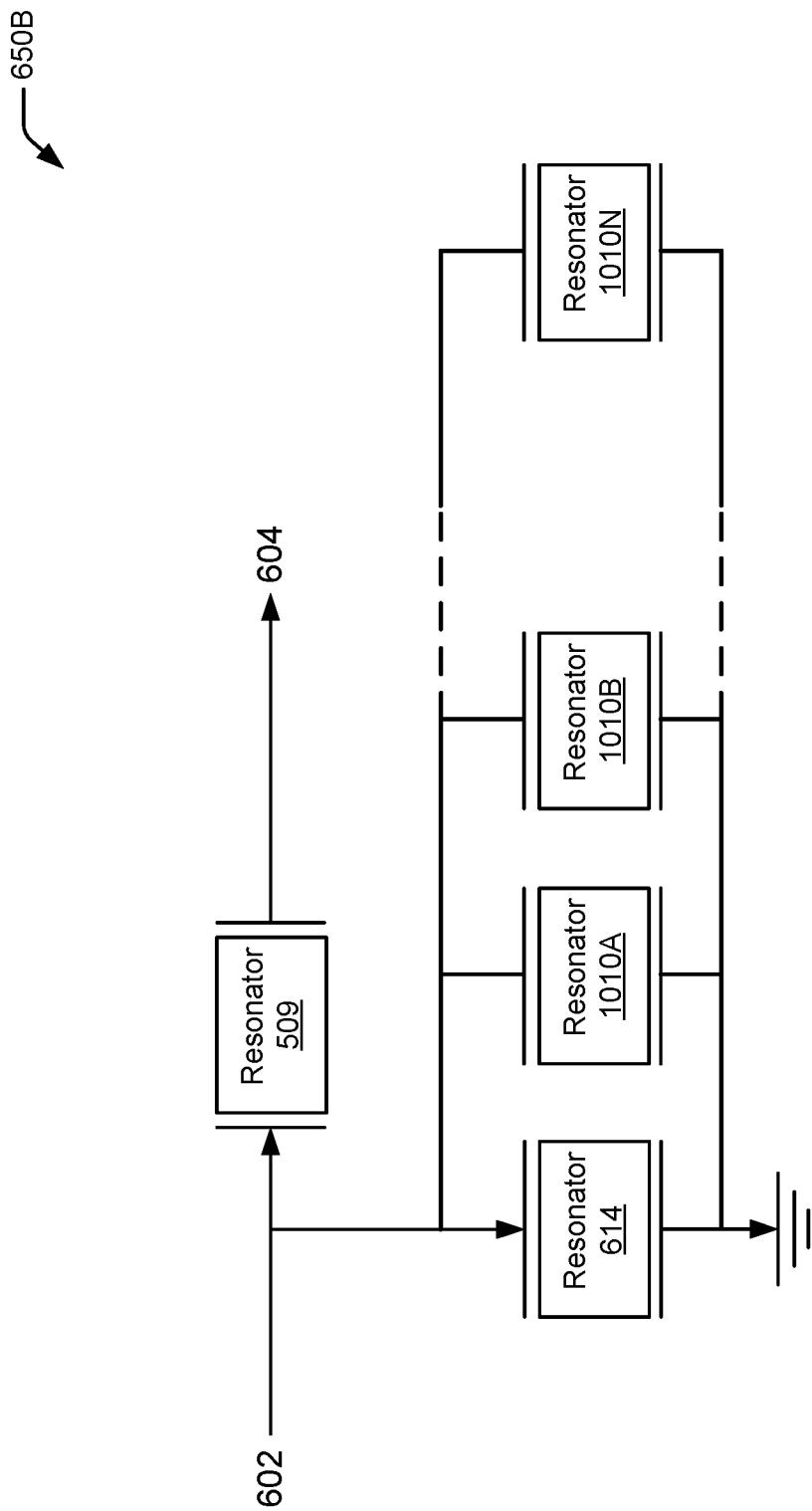
FIG. 10A is a schematic diagram of a resonant structure that may be used with an electroacoustic filter circuit in accordance with examples described herein.

FIG. 10A is a schematic diagram of a resonant structure 650B that may be used with an electroacoustic filter circuit (e.g., filter circuit 500) in accordance with examples described herein. Resonant structure 650B can be one example of a resonant structure 650 used to modify filter circuit 500. Resonant structure 650B includes input 602, output 604, resonator 509 between input 602 and output 604, and resonator 614 between input 602 and a ground potential. The resonator 614 is in parallel with one or more additional resonators 1010A, 1010B, and 1010N. Resonators 1010A-N can generate one or more additional resonances as part of resonant structure 650B to modify the phase values of the antenna reflection coefficient for a filter circuit that includes resonant structure 650B. These parallel resonators 1010A-N can be detuned from a design value (e.g., a value for resonator 514 in a design without a resonant structure) in order to maintain certain design characteristics (e.g., filter passband characteristics) while creating one or more additional resonances outside of (e.g., between) communication bands in a multi-band system. Resonator 614 can be used in part to form the filter passband of the filter that includes the resonant structures.

Figure 10B:
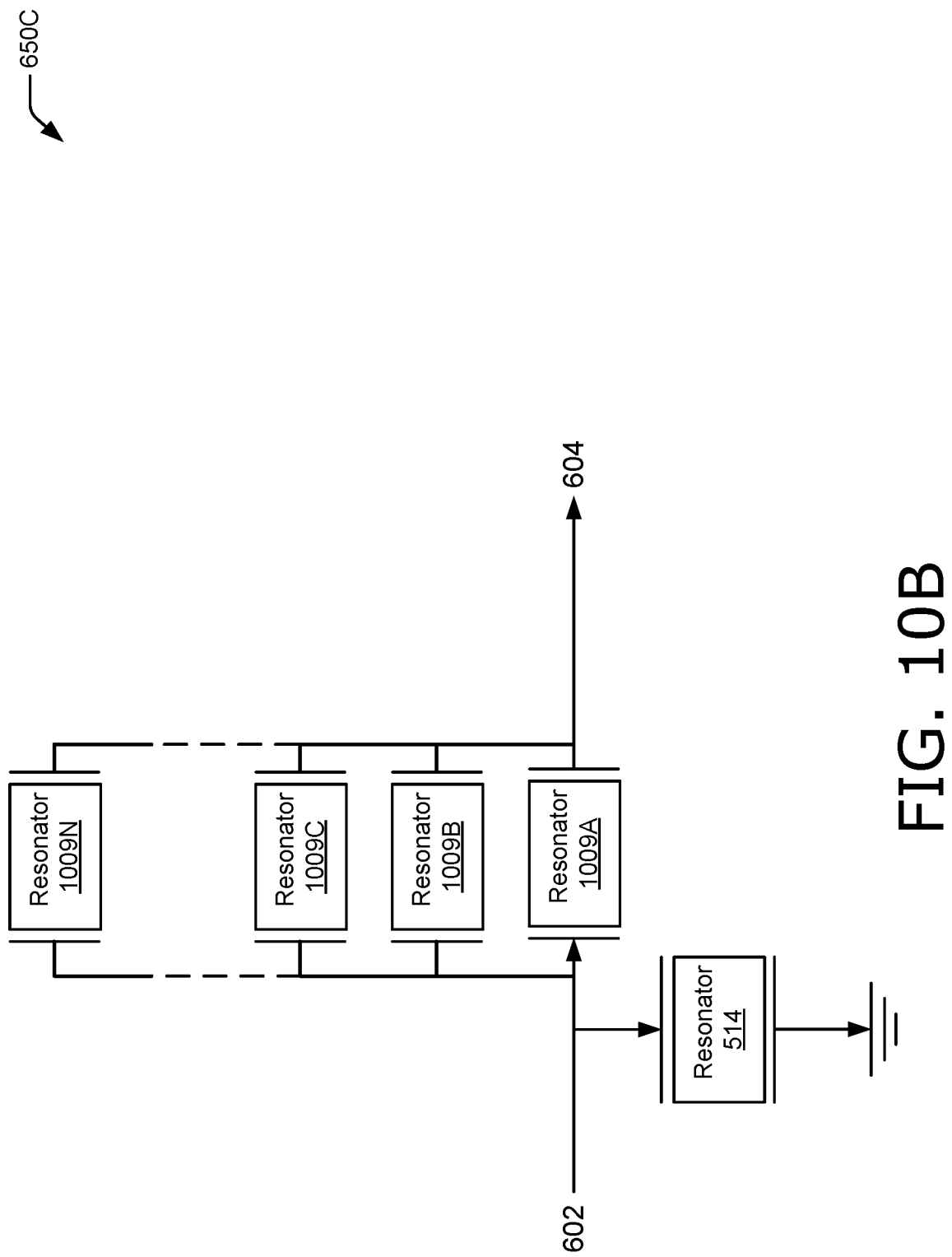
FIG. 10B is a schematic diagram of a resonant structure that may be used with an electroacoustic filter circuit in accordance with examples described herein.

FIG. 10B is a schematic diagram of a resonant structure 650C that may be used with an electroacoustic filter circuit (e.g., filter circuit 500) in accordance with examples described herein. Just as above for resonant structure 650B, resonant structure 650C is another example of a resonant structure 650 that can be used to modify filter circuit 500. Resonant structure 650C includes input 602 and output 604, with resonators 1009A, 1009B, 1009C, through 1009N (referred to as resonators 1009A-1009N) between input 602 and output 604, and resonator 514 having a first terminal coupled between input 602 and resonators 1009A-N, and a second terminal coupled to a ground potential. Resonators 1009A-1009N can be implemented as any number of resonators that add associated additional resonances outside of the communications bands of a multi-band communication system to modify phase values of an antenna reflection coefficient to improve device performance.

Figure 10D:
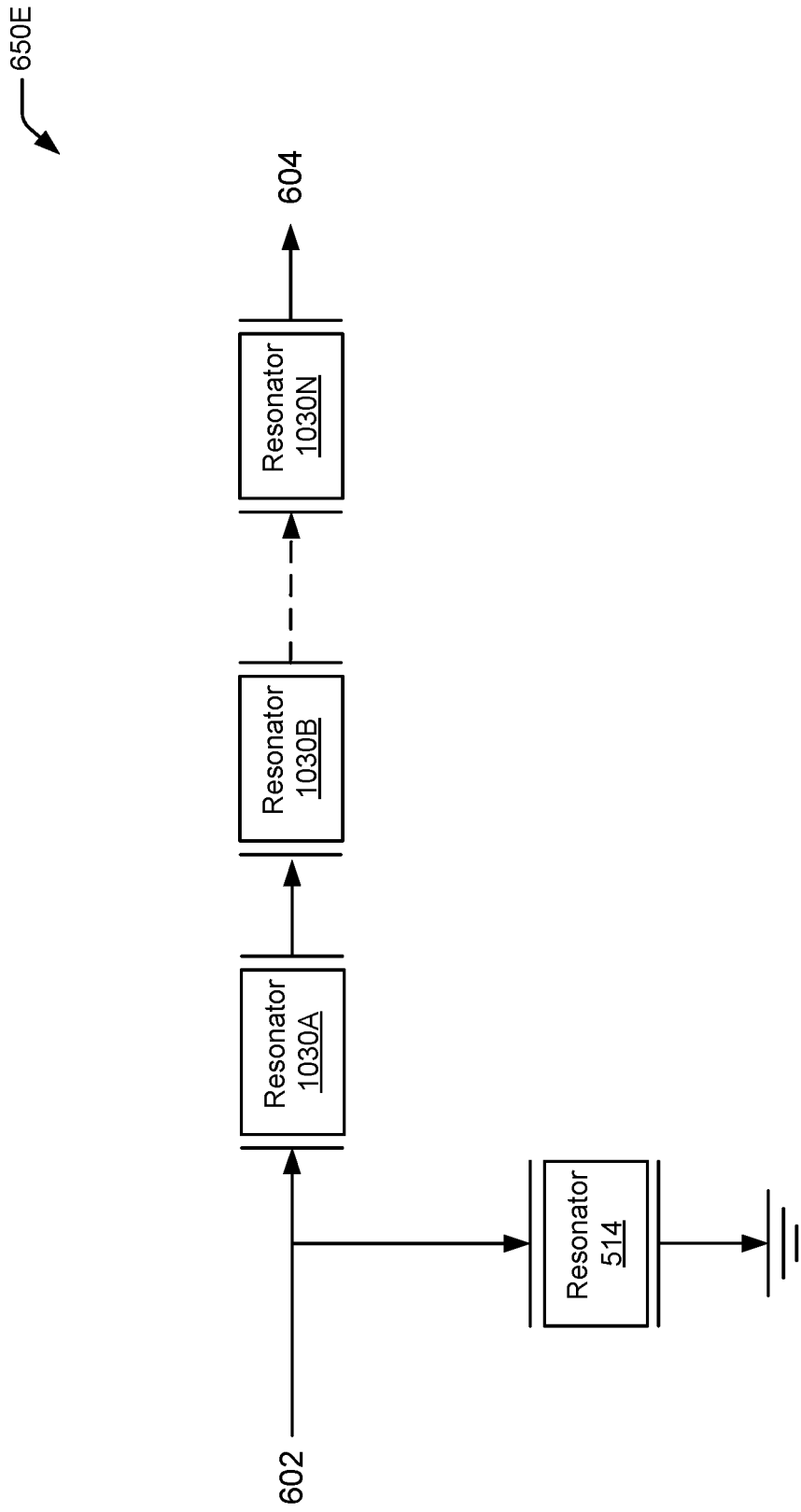
FIG. 10D is a schematic diagram of a resonant structure that may be used with an electroacoustic filter circuit in accordance with examples described herein.

FIG. 10C is a schematic diagram of a resonant structure 650D that may be used with an electroacoustic filter circuit (e.g., filter circuit 500) in accordance with examples described herein. FIG. 10D is a schematic diagram of a resonant structure 650E that may be used with an electroacoustic filter circuit (e.g., filter circuit 500) in accordance with examples described herein. Resonant structures 650D and 650E are, like resonant structures 650A-C, alternate examples of resonant structure 650 that can be used to modify phase values for a filter antenna reflection coefficient in a multi-band communication system. Resonant structure 650D adds a number of resonators 1020A, 1020B, through 1020N in series with one end of the series (e.g., a first terminal of resonator 1020A) coupled between input 602 and resonator 509, and the other end of the series (e.g., a second terminal of resonator 1020N) coupled to a ground potential. Similarly, resonant structure 650E includes a number of resonators in series between input 602 and output 604. Shunt resonator 514 has a first terminal coupled between input 602 and resonator 1030A, and a second terminal coupled to a ground potential. The series of resonators has one end coupled to input 602 (e.g., a first terminal of resonator 1030A) and the other end coupled to output 604 (e.g., a second terminal of resonator 1030N).

Figure 10E:
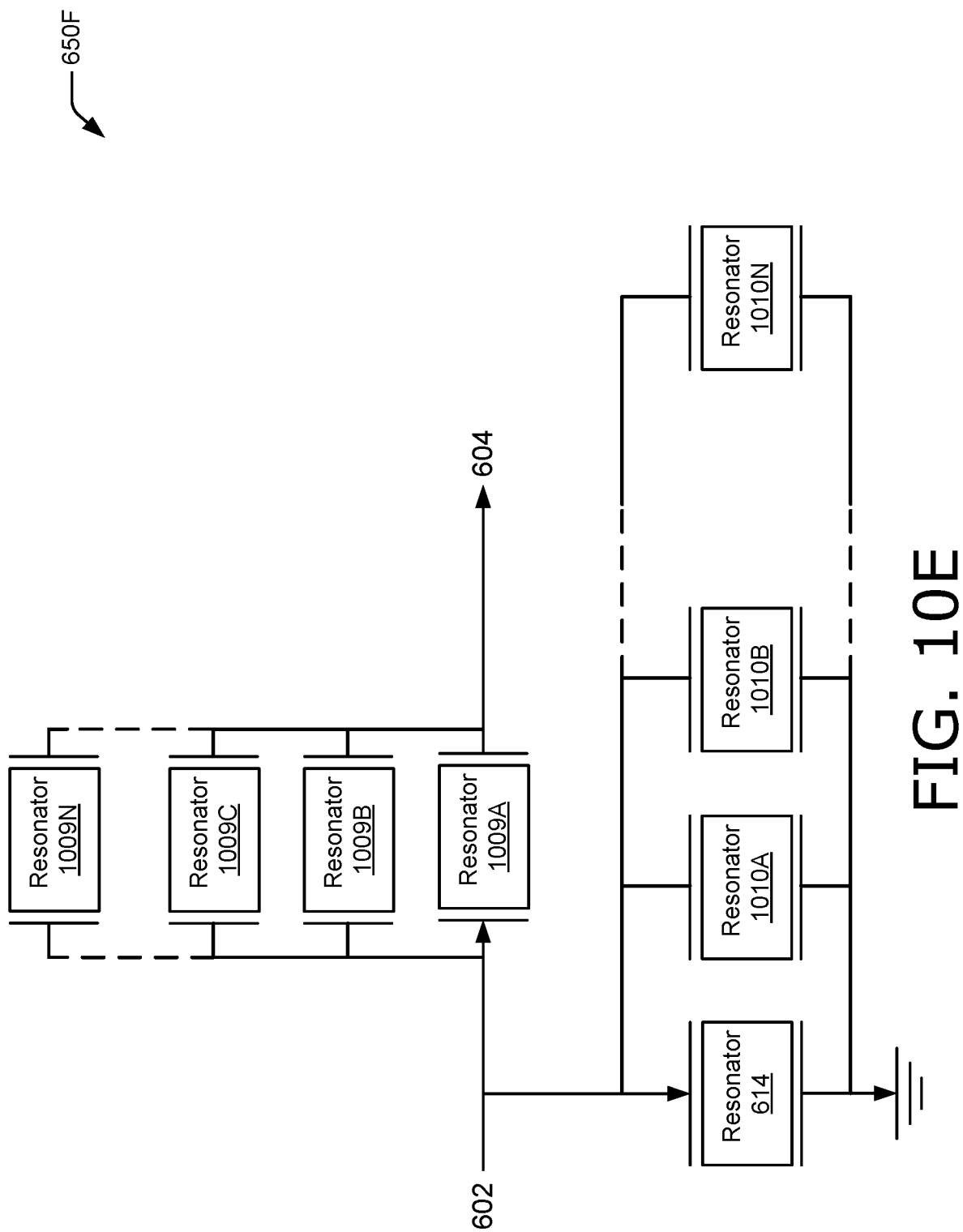
FIG. 10E is a schematic diagram of a resonant structure that may be used with an electroacoustic filter circuit in accordance with examples described herein.
Figure 10F:
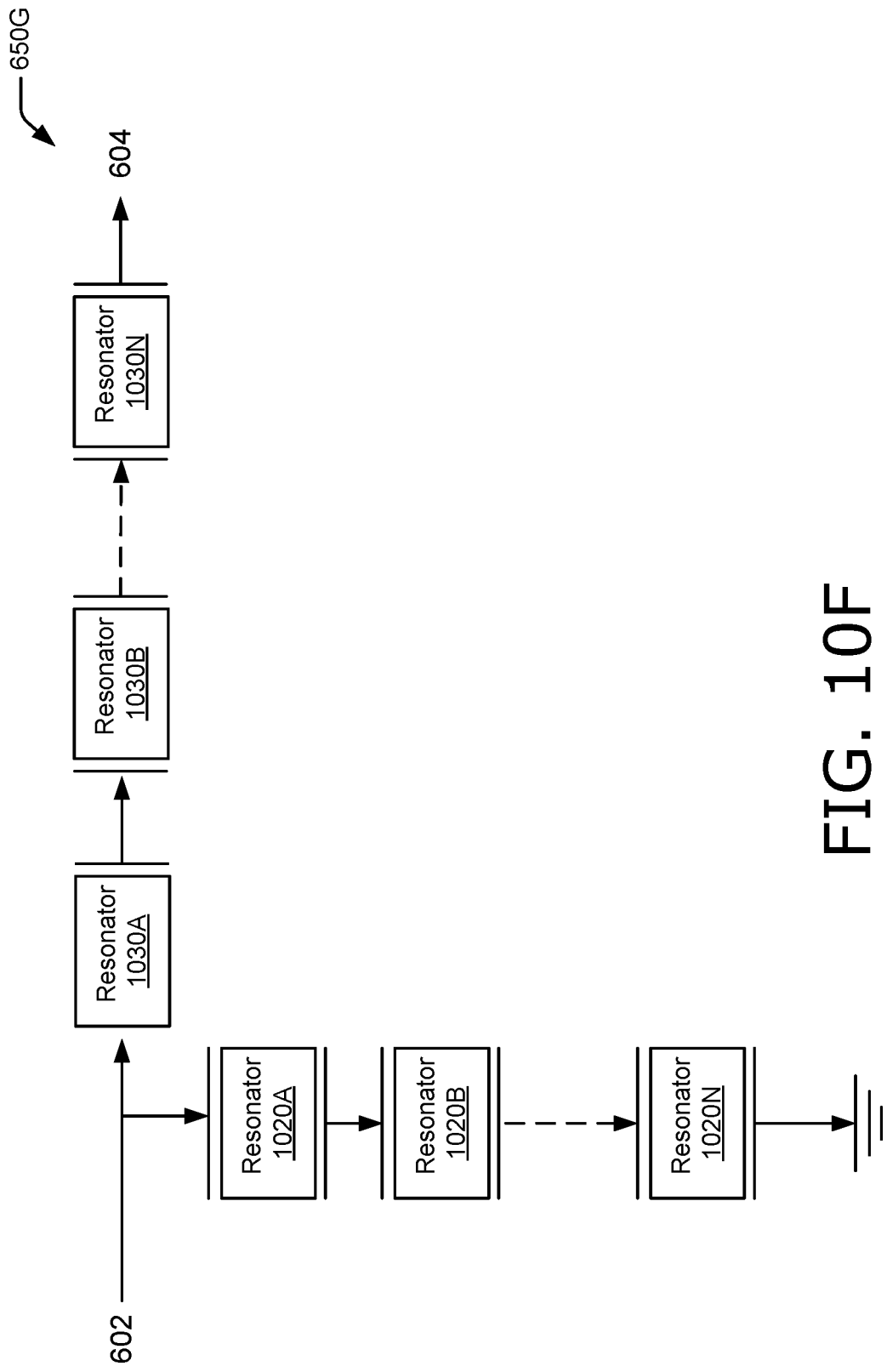
FIG. 10F is a schematic diagram of a resonant structure that may be used with an electroacoustic filter circuit in accordance with examples described herein.

FIG. 10E is a schematic diagram of a resonant structure 650F that may be used with an electroacoustic filter circuit (e.g., filter circuit 500) in accordance with examples described herein. FIG. 10F is a schematic diagram of a resonant structure 650G that may be used with an electroacoustic filter circuit (e.g., filter circuit 500) in accordance with examples described herein.

In addition to the examples of FIGS. 10A-D, additional examples such as resonant structure 650F and 650G can include any combinations of the structures described for resonant structures 650B-E. On example shown as resonant structure 650F of FIG. 10E can include both a plurality of shunt resonators in parallel similar to resonators 614 and 1010A-N of FIG. 10A, as well as a second plurality of parallel in-path resonators similar to resonators 1009A-N of FIG. 10B. Another example shown as resonant structure 650G of FIG. 10F can include both a plurality of shunt resonators in series similar to resonators 1020A-N of FIG. 10C and a second plurality of in-path resonators in series similar to resonators 1030A, 1030B, through 1030N (referred to as resonators 1030A-1030N) of FIG. 10D. Still further examples can include pluralities of shunt resonators in series, with some or all of the in series resonators having one or more added resonators in parallel. In some examples, any resonator can be replaced with any combination of series resonators, and any resonator can have a parallel resonator added. These resonators can be added or configured as part of a resonant structure described above to add resonance values between communication bands to an antenna reflection coefficient response. Any such resonance structures or combinations of resonant structures can be configured to add resonances outside of a band associated with the filter circuit including the resonant structure(s). Additionally, the resonances can be configured to be closer to a second band than to the first band associated with the filter circuit including the resonant structure(s). Further still, as described herein, the resonant structure or structures can be positioned close to a terminal of the multiplexer to propagation of reflections down the circuit ladder of the filter circuit that includes the resonant structure(s).

While FIG. 7 illustrates a single additional resonance 722, a resonant structure with multiple added resonators as described above can have any number of added resonances. These resonances can be between different communication bands. For example, while FIG. 7 shows a single additional resonance 722 between band 766 and band 767, another alternate example can have an additional resonance between any of the bands 763-766 or any other bands below band 763, so long as the resonances are not inside any particular band, as an in-band resonance would significantly degrade performance. The particular additional resonances can be designed to shift or compress phase values of an antenna reflection coefficient to improve performance, while avoiding interference with in band signals in a way that distorts communications and degrades system performance. Further still, in some examples, multiple resonances can be added between two bands. For example, a second resonance can be added between band 766 and 767 along with additional resonance 722.

Further still, as shown by FIG. 5B, a multiplexer can include many filters (e.g., filters 500, 552, 554, 560, 562, etc.) The additional resonance 722 of FIG. 7 describes the results of a resonant structure added to a single filter. Any number of filters in a multiplexed system can include a resonant structure (e.g., resonant structure 650) or many resonant structures in different embodiments. As such structures are added to multiple filters or all filters that are multiplexed together, the resonant structures for multiple filters (e.g., different resonant structures for filters 552 and 560) can be coordinated to prevent interactions between resonant structures from conflicting.

The particular additional resonance values selected for creation using resonant structures can be defined according to various different applications and scenarios. According to some aspects, a resonance value can be closer to a counter band than to a band associated with a filter that includes the resonant structure that generates the resonance value. According to some aspects, a resonance value can be a threshold distance (e.g., a given frequency range or percentage of a distance to a counter band) away from a frequency band associated with the filter including the resonant structure generating the resonance value (e.g., a resonance at a frequency outside of a passband of the filter). In other aspects, other system characteristics can be used to design and select any number of resonance values in accordance with examples described herein. These resonance values can be used as part of a design for systematic manipulation of the phase characteristics of the antenna reflection coefficient in order to reduce the phase spread and, consequently, reduce multiplexing losses.

Aspects of certain examples solve the problem described above (e.g., losses associated with large phase angles) by the introduction of one or multiple resonant structures into the propagation path of an electroacoustic filter (e.g., filter circuit 500), into components in the surroundings of the electroacoustic filter (e.g. the laminate carrier that a filter circuit is attached to) or a combination of both. Aspects of one example electroacoustic filter include a ladder network of series and shunt resonators. In some examples, resonant structures to manipulate phase angles create resonances that are electrically effective at the antenna node (e.g., antenna node 580), but they do not have to be necessarily electrically connected directly to the antenna node. For example, the resonant structures can be electrically connected via resonators having elements (e.g., busbars) that are electrically connected but not in direct physical contact.

In some examples, the resonant structures are designed in such a way that the resulting additional resonance frequencies (e.g., additional resonance 722) are localized above and/or below the frequency bands to which a phase spread reduction is applied to improve device performance. The phase characteristics of the antenna reflection coefficient can be systematically manipulated using such resonant structures to reduce the phase spread in the selected frequency ranges.

In some examples, a resonant structure in accordance with examples described herein is designed by splitting of an existing shunt resonator in a filter design without a resonant structure for an additional resonance. Once the resonator is split, one resonator maintains a set value, and the finger period of an additional (e.g., newly added from the split) resonator is increased so that the acoustic resonance of the resonator shifts down in frequency to position it above the transmission band for the filter that includes the resonant structure. The phase characteristics of the additional resonance(s) systematically manipulates the overall phase characteristics of the antenna reflection coefficient of the filter circuit that includes the resonant structure. As a result, the phase spread in the frequency range of across counter bands (e.g., from 1710 MHz to 2400 MHz in one example), is reduced. The reduction in phase spread can provide a significant improvement in insertion loss of the filters associated with the counter bands due to the phase spread reduction associated with the added resonant structure (e.g., the added resonator). At the same time, the values for the resonance frequency can be selected so that electrical performance of the other bands in the multiplexer is not impacted. In some examples, the resonator within the filter is configured in a position close to a terminal of the multiplexer. In some configurations, this limits propagation of reflections down the circuit ladder.

As described above, aspects of additional examples can include filter circuits with multiple additional resonances generated within the propagation path of the electroacoustic filter. The multiple additional resonances can be individually tuned with resonant structure values (e.g., selection of finger period values in a resonator, or other design selections) to center the resonance frequencies at different frequency values over a large frequency range. The phase spread can be reduced not only for one frequency range, but for multiple frequency ranges using the multiple additional resonances. In some examples, multiple resonances added with resonant structures can reduce multiplexing losses for several frequency bands.

In general, the resonant structures do not necessarily have to be part of the electroacoustic filter itself but can also be realized in the laminate carrier where the filter is assembled to (e.g. as inductor-capacitor (LC) resonant circuits using surface mount components or components that are integrated into the laminate carrier itself). In other examples, resonant structures can be partly realized within the filter (e.g. an on-chip capacitor or resonator) and partly within the laminate carrier (e.g. with an embedded inductor coil).

Aspects of examples described herein can include multiple advantages depending on the particular example. In some examples, resonant structures with additional resonances can be applied to different types of acoustic filters independent of the filter technology (e.g., SAW filters, BAW filters, half-lattice or lattice filters, LC filters, etc.) Various examples can be fabricated with existing production processes without adaption of new fabrication processes or operations. In some examples, the additional resonances can be included in a design with resonant structures fabricated within the circuit of an electroacoustic filter without requiring any extra space or additional components. In some examples, a resonant structure can be included in a design with no size increase and little or no cost impact on a device. In some examples, a resonant structure can be performance neutral in a band associated with a filter, with the only statistically significant impact being an improvement in counter band filter performance due to the modified phase angle of the antenna reflection coefficient for the modified filter circuit. The resonant structure can be adapted to any frequency band filter, independent of the frequency range, within the operational frequencies of the associated resonance structure technologies (e.g., SAW, BAW, LC elements, etc.) in use for a filter and can be applied to several filters in a multiplexer configuration at the same time. The above combination of advantages can thus be used to improve communication device performance by modifying phase angle values for a filter circuit in a multi-band design (e.g., with a multiplexed filter circuit) with flexible design options to limit the impact on design size, fabrication technology use, or other design considerations.

Additional illustrative examples of the disclosure include:

Example 1

A wireless communication apparatus for a multi-band system, the wireless communication apparatus comprising: a frequency band filter circuit for a first band of the multi-band system, the frequency band filter circuit comprising: an antenna port; a signal port for transmitting and receiving signals in the first band; and a plurality of resonators configured to couple the signal port to the antenna port as part of a transmission path; and a resonant structure electrically coupled to the plurality of resonators in the transmission path, wherein the resonant structure has a resonance outside of the first band and a second band of the multi-band system, the resonance being closer to the second band than to the first band.

Example 2

The wireless communication apparatus of example 1, wherein the multi-band system comprises the first band, the second band, and a third band between the first band and the second band, and wherein the resonance of the resonant structure is at a frequency between the third band and the second band.

Example 3

The wireless communication apparatus of example 1 further comprising: a plurality of frequency band filter circuits comprising the frequency band filter circuit for the first band, a frequency band filter circuit for the second band, and a frequency band filter circuit for a third band.

Example 4

The wireless communication apparatus of example 3, wherein the plurality of frequency band filter circuits comprise micro-electroacoustic filters implemented as surface acoustic wave devices.

Example 5

The wireless communication apparatus of example 3, wherein the plurality of frequency band filter circuits comprise micro-electroacoustic filters implemented as bulk acoustic wave devices.

Example 6

The wireless communication apparatus of examples 3-5, comprising a second frequency band filter circuit for the second band of the multi-band system, the second frequency band filter circuit comprising: a second antenna port coupled to the antenna port via a multiplexer; a second signal port for transmitting and receiving signals in the second band; and a second plurality of resonators configured to couple the second signal port to the second antenna port, wherein a resonant structure of the second plurality of resonators has a second resonance outside of the first band and the second band of the multi-band system, the second resonance being closer to the first band than to the second band.

Example 7

The wireless communication apparatus of examples 3-6, comprising a multiplexer with switching circuitry to select between filters of the plurality of frequency band filter circuits.

Example 8

The wireless communication apparatus of any examples above, wherein the resonant structure reduces a phase angle of an antenna reflection coefficient in the second band.

Example 9

The wireless communication apparatus of example 8, wherein the resonant structure reduces a second phase angle of a second antenna reflection coefficient in a third band.

Example 10

The wireless communication apparatus any examples above, wherein the plurality of resonators configured to couple the signal port to the antenna port comprise: a first resonator having a first terminal coupled to the signal port and a second terminal; a second resonator having a first terminal connected to the second terminal of the first resonator, the second resonator having a second terminal connected to a ground; a third resonator having a first terminal coupled to the second terminal of the first resonator, the third resonator having a second terminal connected to the resonant structure; and a fourth resonator having a first terminal connected to the second terminal of the third resonator, the fourth resonator having a second terminal connected to the ground.

Example 11

The wireless communication apparatus of any examples above, wherein the resonant structure comprises: an input coupled to the signal port via the plurality of resonators other than the resonant structure; an output coupled to the antenna port; a first resonator having a first terminal coupled to the input, the first resonator having a second terminal coupled to the output; and a second resonator having a first terminal coupled to the first terminal of the first resonator, the second resonator having a second terminal coupled to a ground.

Example 12

The wireless communication apparatus of example 11, wherein the resonant structure comprises a third resonator having a first terminal coupled to the first terminal of the second resonator, the third resonator having a second terminal coupled to the second terminal of the second resonator.

Example 13

The wireless communication apparatus of example 12, wherein the resonant structure comprises one or more additional resonators coupled in parallel with the second resonator and the third resonator.

Example 14

The wireless communication apparatus of example 12, wherein the resonant structure comprises one or more additional resonators coupled in parallel with the first resonator.

Example 15

The wireless communication apparatus of example 11, wherein the resonant structure comprises one or more additional resonators in series between the ground and the second terminal of the second resonator.

Example 16

The wireless communication apparatus of example 11, wherein the resonant structure comprises one or more additional resonators in series between the output of the resonant structure and the second terminal of the first resonator.

Example 17

The wireless communication apparatus of example 11, wherein the resonant structure comprises a plurality of additional resonators, each resonator of the plurality of additional resonators being configured: in series between the output of the resonant structure and the second terminal of the first resonator; in series between the ground and the second terminal of the second resonator; in parallel with the first resonator; or in parallel with the second resonator.

Example 18

The wireless communication apparatus of any examples above, wherein the first band is from 2110 Megahertz (MHz) to 2170 MHz.

Example 19

The wireless communication apparatus of example 15, wherein the second band is 2300 MHz to 2400 MHz.

Example 20

The wireless communication apparatus of any examples above, wherein the resonant structure is implemented in a shared substrate with the frequency band filter circuit.

Example 21

The wireless communication apparatus of any examples above, wherein the resonant structure is implemented using surface mount components coupled to a substrate for the frequency band filter circuit.

Example 22

The wireless communication apparatus of any examples above, wherein the resonant structure is implemented at least partially in a laminate carrier coupled to a substrate for the frequency band filter circuit.

Example 23

The wireless communication apparatus of any examples above, comprising an antenna coupled to the antenna port; and processing circuitry coupled to the signal port.

Example 24

The wireless communication apparatus of any examples above, comprising a mobile communication device including a transceiver circuit, wherein the transceiver circuit includes the frequency band filter circuit.

Example 25

A wireless communication apparatus for a multi-band system, the apparatus comprising: a frequency band filter circuit for a first band of the multi-band system, the frequency band filter circuit comprising: an antenna port; a signal port for transmitting and receiving signals in the first band; and a plurality of resonators configured to couple the signal port to the antenna port, wherein a resonant structure of the plurality of resonators has a resonance outside of the first band and a second band of the multi-band system, the resonance being centered at a frequency greater than a threshold range outside of the first band.

Example 26

The wireless communication apparatus of example 25, wherein the multi-band system comprises the first band, the second band, and a third band between the first band and the second band, and wherein the resonance of the resonant structure is at a frequency between the third band and the second band.

Example 27

The wireless communication apparatus of example 25 further comprising: a plurality of frequency band filter circuits comprising the frequency band filter circuit for the first band, a frequency band filter circuit for the second band, and a frequency band filter circuit for a third band.

Example 28

The wireless communication apparatus of example 25 further comprising the limitations of any of examples 3-24 above.

Example 29

A wireless communication device for a multi-band system, the wireless communication device comprising: a plurality of frequency band filter circuits; one or more antennas; a multiplexer configured to multiplex signals between the plurality of frequency band filter circuits and the one or more antennas; processing circuitry coupled to the plurality of frequency band filter circuits; and a first frequency band filter circuit of the plurality of frequency band filter circuits comprising: an antenna port coupled to the multiplexer; a signal port coupled to the processing circuitry for transmitting and receiving signals in a first frequency band; a plurality of resonators configured to couple the signal port to the antenna port as part of a transmission path; and a resonant structure electrically coupled to the plurality of resonators in the transmission path, wherein the resonant structure has a resonance outside of the first frequency band and a second frequency band of the multi-band system, the resonance being closer to the second frequency band than to the first frequency band, and wherein the second frequency band is associated with a second frequency band filter circuit of the plurality of frequency band filter circuits.

Example 30

The wireless communication device of example 29, wherein the plurality of frequency band filter circuits comprise micro-electroacoustic filters implemented as surface acoustic wave devices.

Example 31

The wireless communication device of example 29 further including any of the limitations of examples 3-24 above.

Example 32

A wireless communication apparatus for a multi-band system, the wireless communication apparatus comprising: a frequency band filter circuit for a first band of the multi-band system, the frequency band filter circuit comprising: an antenna port; a signal port for transmitting and receiving signals in the first band; and a plurality of resonators configured to couple the signal port to the antenna port as part of a transmission path; and means for generating a resonance outside of the first band and a second band of the multi-band system, the resonance being closer to the second band than to the first band.

Example 33

The wireless communication apparatus of example 32, wherein the multi-band system comprises the first band, the second band, and a third band between the first band and the second band, and wherein the resonance of the resonant structure is at a frequency between the third band and the second band.

Example 34

The wireless communication apparatus of example 32 further comprising: a plurality of frequency band filter circuits comprising the frequency band filter circuit for the first band, a frequency band filter circuit for the second band, and a frequency band filter circuit for a third band.

Example 35

The wireless communication apparatus of example 34, comprising a second frequency band filter circuit for the second band of the multi-band system, the second frequency band filter circuit comprising: a second antenna port coupled to the antenna port via a multiplexer; a second signal port for transmitting and receiving signals in the second band; and a second plurality of resonators configured to couple the second signal port to the second antenna port; and means for generating a second resonance outside of the first band and the second band of the multi-band system, the second resonance being closer to the first band than to the second band.

Example 36

The wireless communication apparatus of example 34, comprising a multiplexer with switching circuitry to select between filters of the plurality of frequency band filter circuits.

Example 37

The wireless communication apparatus of example 32 further comprising means for reducing a phase angle of an antenna reflection coefficient in the second band.

Example 38

The wireless communication apparatus of example 37, further comprising means for reducing a second phase angle of a second antenna reflection coefficient in a third band.

Example 39

The wireless communication apparatus of example 32, wherein the first band is from 2110 Megahertz (MHz) to 2170 MHz.

Example 40

The wireless communication apparatus of example 39, wherein the second band is 2300 MHz to 2400 MHz.

Example 41

The wireless communication apparatus of examples 32-40, comprising means for transmitting or receiving a wireless communication coupled to the antenna port Example 42

The wireless communication apparatus of examples 32-41, comprising means for processing communication signals coupled to the signal port.

Example 43

The wireless communication apparatus of examples 32-42, comprising display means coupled to the means for processing the communication signals.

Example 44

A wireless communication apparatus for a multi-band system, the wireless communication apparatus comprising: a frequency band filter circuit having a filter passband that includes a first band of the multi-band system, the frequency band filter circuit comprising: a plurality of resonators coupled between an antenna port and a signal port; and a resonant structure electrically coupled to the plurality of resonators, wherein the resonant structure has a resonance outside of the first band and a second band of the multi-band system, the resonance being closer to the second band than to the first band.

Example 45

The wireless communication apparatus of example 44, wherein the multi-band system comprises the first band, the second band, and a third band between the first band and the second band, and wherein the resonance of the resonant structure is at a frequency between the third band and the second band.

Example 46

The wireless communication apparatus of examples 44-45 further comprising: a plurality of frequency band filter circuits comprising the frequency band filter circuit for the first band, a frequency band filter circuit for the second band, and a frequency band filter circuit for a third band.

Example 47

The wireless communication apparatus of example 46, wherein the plurality of frequency band filter circuits comprise micro-electroacoustic filters implemented as surface acoustic wave devices.

Example 48

The wireless communication apparatus of example 46, wherein the plurality of frequency band filter circuits comprise micro-electroacoustic filters implemented as bulk acoustic wave devices.

Example 49

The wireless communication apparatus of example 46, comprising a second frequency band filter circuit for the second band of the multi-band system, the second frequency band filter circuit comprising: a second plurality of resonators electrically coupled between the antenna port and a second signal port, wherein a resonant structure of the second plurality of resonators has a second resonance outside of the first band and the second band of the multi-band system, the second resonance being closer to the first band than to the second band.

Example 50

The wireless communication apparatus of example 46, comprising a multiplexer circuit with switching circuitry to select between filters of the plurality of frequency band filter circuits, wherein the multiplexer circuit comprises the frequency band filter circuit.

Example 51

The wireless communication apparatus of examples 44-50, wherein the resonant structure reduces a phase angle of an antenna reflection coefficient in the second band.

Example 52

The wireless communication apparatus of example 51, wherein the resonant structure reduces a second phase angle of a second antenna reflection coefficient in a third band.

Example 53

The wireless communication apparatus of example 44, wherein the plurality of resonators configured to couple the signal port to the antenna port comprise: a first resonator having a first terminal coupled to the signal port and a second terminal; a second resonator having a first terminal connected to the second terminal of the first resonator, the second resonator having a second terminal connected to a ground; a third resonator having a first terminal coupled to the second terminal of the first resonator, the third resonator having a second terminal connected to the resonant structure; and a fourth resonator having a first terminal connected to the second terminal of the third resonator, the fourth resonator having a second terminal connected to the ground.

Example 54

The wireless communication apparatus of example 44, wherein the resonant structure comprises: an input coupled to the signal port via the plurality of resonators other than the resonant structure; an output coupled to the antenna port; a first resonator having a first terminal coupled to the input, the first resonator having a second terminal coupled to the output; and a second resonator having a first terminal coupled to the first terminal of the first resonator, the second resonator having a second terminal coupled to a ground.

Example 55

The wireless communication apparatus of example 54, wherein the resonant structure comprises a third resonator having a first terminal coupled to the first terminal of the second resonator, the third resonator having a second terminal coupled to the second terminal of the second resonator.

Example 56

The wireless communication apparatus of example 55, wherein the resonant structure comprises one or more additional resonators coupled in parallel with the second resonator and the third resonator.

Example 57

The wireless communication apparatus of example 55, wherein the resonant structure comprises one or more additional resonators coupled in parallel with the first resonator.

Example 58

The wireless communication apparatus of example 54, wherein the resonant structure comprises one or more additional resonators in series between the ground and the second terminal of the second resonator.

Example 59

The wireless communication apparatus of example 54, wherein the resonant structure comprises one or more additional resonators in series between the output of the resonant structure and the second terminal of the first resonator.

Example 60

The wireless communication apparatus of example 54, wherein the resonant structure comprises a plurality of additional resonators, each resonator of the plurality of additional resonators being configured: in series between the output of the resonant structure and the second terminal of the first resonator; in series between the ground and the second terminal of the second resonator; in parallel with the first resonator; or in parallel with the second resonator.

Example 61

The wireless communication apparatus of examples 44-60, wherein the plurality of resonators and one or more resonators of the resonant structure are micro-acoustic.

Example 62

A wireless communication apparatus for a multi-band system, the apparatus comprising: a frequency band filter circuit for a first band of the multi-band system, the frequency band filter circuit comprising: an antenna port; a signal port for transmitting and receiving signals in the first band; and a plurality of resonators configured to couple the signal port to the antenna port, wherein a resonant structure of the plurality of resonators has a resonance outside of the first band and a second band of the multi-band system, the resonance being centered at a frequency greater than a threshold range outside of the first band.

Example 63

The wireless communication apparatus of example 62, wherein the multi-band system comprises the first band, the second band, and a third band between the first band and the second band, and wherein the resonance of the resonant structure is at a frequency between the third band and the second band.

Example 64

A wireless communication device for a multi-band system, the wireless communication device comprising: a plurality of frequency band filter circuits; a multiplexer configured to multiplex signals between the plurality of frequency band filter circuits and one or more antennas; processing circuitry coupled to the plurality of frequency band filter circuits; and a first frequency band filter circuit of the plurality of frequency band filter circuits having a passband including a first frequency band, the first frequency band filter circuit comprising: a plurality of resonators coupled between the multiplexer and a filter input port; and a resonant structure electrically coupled to the plurality of resonators, wherein the resonant structure has a resonance outside of the first frequency band and a second frequency band of the multi-band system, the resonance being closer to the second frequency band than to the first frequency band, and wherein the second frequency band is associated with a second frequency band filter circuit of the plurality of frequency band filter circuits.

Example 65

A method of filtering a signal in a wireless communication apparatus for a multi-band system, the method comprising: receiving the signal at a frequency band filter circuit having a filter passband that includes a first band of the multi-band system, the frequency band filter circuit comprising a plurality of resonators coupled between an antenna port and a signal port and a resonant structure electrically coupled to the plurality of resonators; and filtering the signal using the frequency band filter circuit, wherein filtering is configured with a resonance outside of the first band and a second band of the multi-band system, the resonance being closer to the second band than to the first band.

Example 66 method of example 66, wherein filtering the signal is further configured with the resonant structured coupled between the plurality of resonators and the signal port to reduce propagation of reflected signals to the plurality of resonators.

Figure 11:
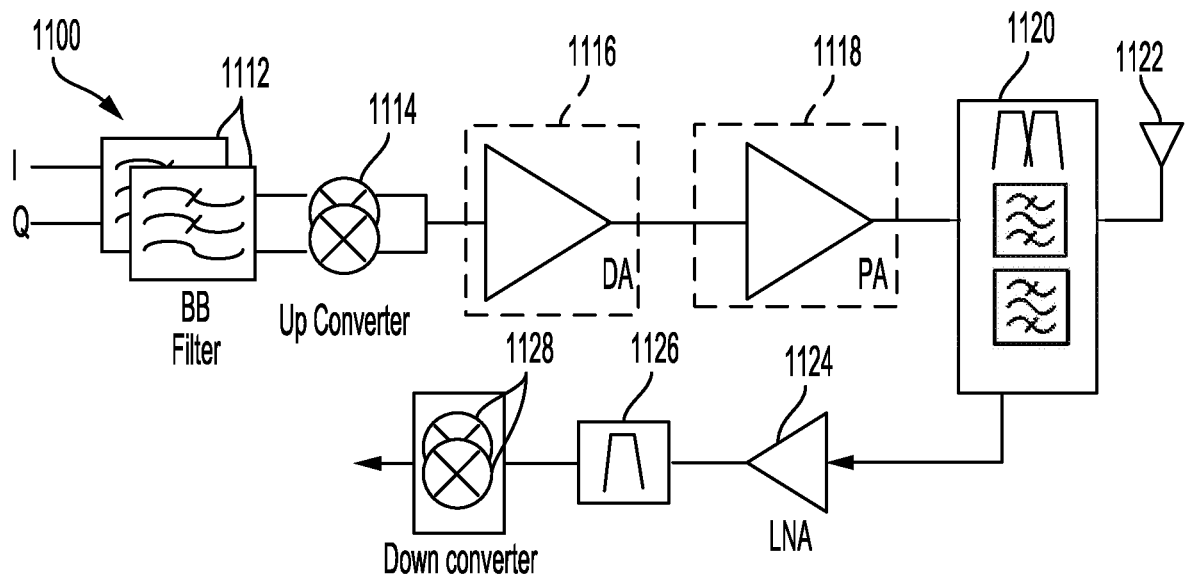
FIG. 11 is a functional block diagram of at least a portion of an example of a simplified wireless transceiver circuit in which the filter circuits and associated resonant structures of FIGS. 5, 6A, 6B, 10A, 10B, 10C, 10D, 10E, 10F, may be employed.

FIG. 11 is a functional block diagram of at least a portion of an example of a simplified wireless transceiver circuit 1100 in which the filter circuit 600 of FIG. 6A may be employed. The transceiver circuit 1100 is configured to receive signals/information for transmission (shown as I and Q values) which is provided to one or more base band filters 1112. The filtered output is provided to one or more mixers 1114. The output from the one or more mixers 1114 is provided to a driver amplifier 1116 whose output is provided to a power amplifier 1118 to produce an amplified signal for transmission. The amplified signal is output to the antenna 1122 through one or more filters 1120 (e.g., duplexers if used as a frequency division duplex transceiver or other filters). The one or more filters 1120 may include the filter circuit 600 of FIG. 6. The antenna 1122 may be used for both wirelessly transmitting and receiving data. The transceiver circuit 1100 includes a receive path through the one or more filters 1120 to be provided to a low noise amplifier (LNA) 1124 and a further filter 1126 and then down-converted from the receive frequency to a baseband frequency through one or more mixer circuits 1128 before the signal is further processed (e.g., provided to an analog digital converter and then demodulated or otherwise processed in the digital domain). There may be separate filters for the receive circuit (e.g., may have a separate antenna or have separate receive filters) that may be implemented using the filter circuit 600 of FIG. 6A.

Figure 12:
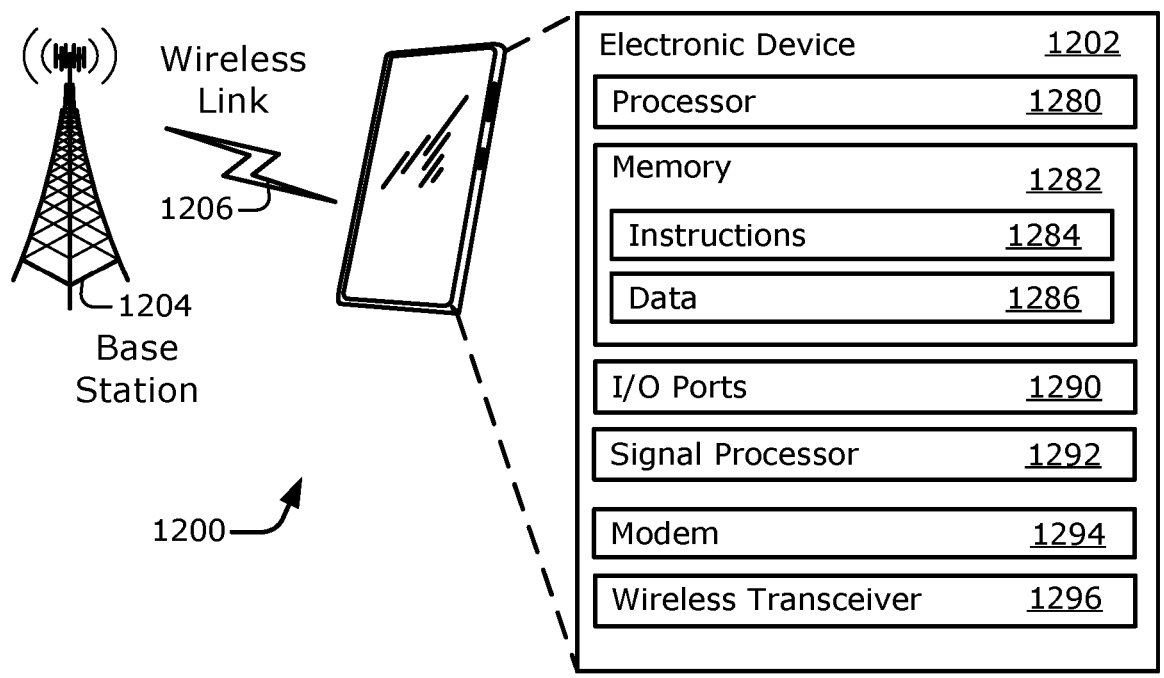
FIG. 12 is a diagram of an environment that includes an electronic device that includes a wireless transceiver such as the transceiver circuit of FIG. 11.

FIG. 12 is a diagram of an environment 1200 that includes an electronic device 1202 that includes a wireless transceiver 1296 such as the transceiver circuit 1100 of FIG. 11. In the environment 1200, the electronic device 1202 communicates with a base station 1204 through a wireless link 1206. As shown, the electronic device 1202 is depicted as a smart phone. However, the electronic device 1202 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1204 communicates with the electronic device 1202 via the wireless link 1206, which may be implemented as any suitable type of wireless link. Although depicted as a base station tower of a cellular radio network, the base station 1204 may represent or be implemented as another device, such as a satellite, terrestrial broadcast tower, access point, peer to peer device, mesh network node, fiber optic line, another electronic device generally as described above, and so forth. Hence, the electronic device 1202 may communicate with the base station 1204 or another device via a wired connection, a wireless connection, or a combination thereof. The wireless link 1206 can include a downlink of data or control information communicated from the base station 1204 to the electronic device 1202 and an uplink of other data or control information communicated from the electronic device 1202 to the base station 1204. The wireless link 1206 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1202 includes a processor 1280 and a memory 1282. The memory 1282 may be or form a portion of a computer readable storage medium. The processor 1280 may include any type of processor, such as an application processor or a multi-core processor, that is configured to execute processor-executable instructions (e.g., code) stored by the memory 1282. The memory 1282 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1282 is implemented to store instructions 1284, data 1286, and other information of the electronic device 1202, and thus when configured as or part of a computer readable storage medium, the memory 1282 does not include transitory propagating signals or carrier waves.

The electronic device 1202 may also include input/output ports 1290. The I/O ports 1290 enable data exchanges or interaction with other devices, networks, or users or between components of the device.

The electronic device 1202 may further include a signal processor (SP) 1292 (e.g., such as a digital signal processor (DSP)). The signal processor 1292 may function similar to the processor and may be capable executing instructions and/or processing information in conjunction with the memory 1282.

For communication purposes, the electronic device 1202 also includes a modem 1294, a wireless transceiver 1296, and an antenna (not shown). The wireless transceiver 1296 provides connectivity to respective networks and other electronic devices connected therewith using radio-frequency (RF) wireless signals and may include the transceiver circuit 1100 of FIG. 11. The wireless transceiver 1296 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 13:
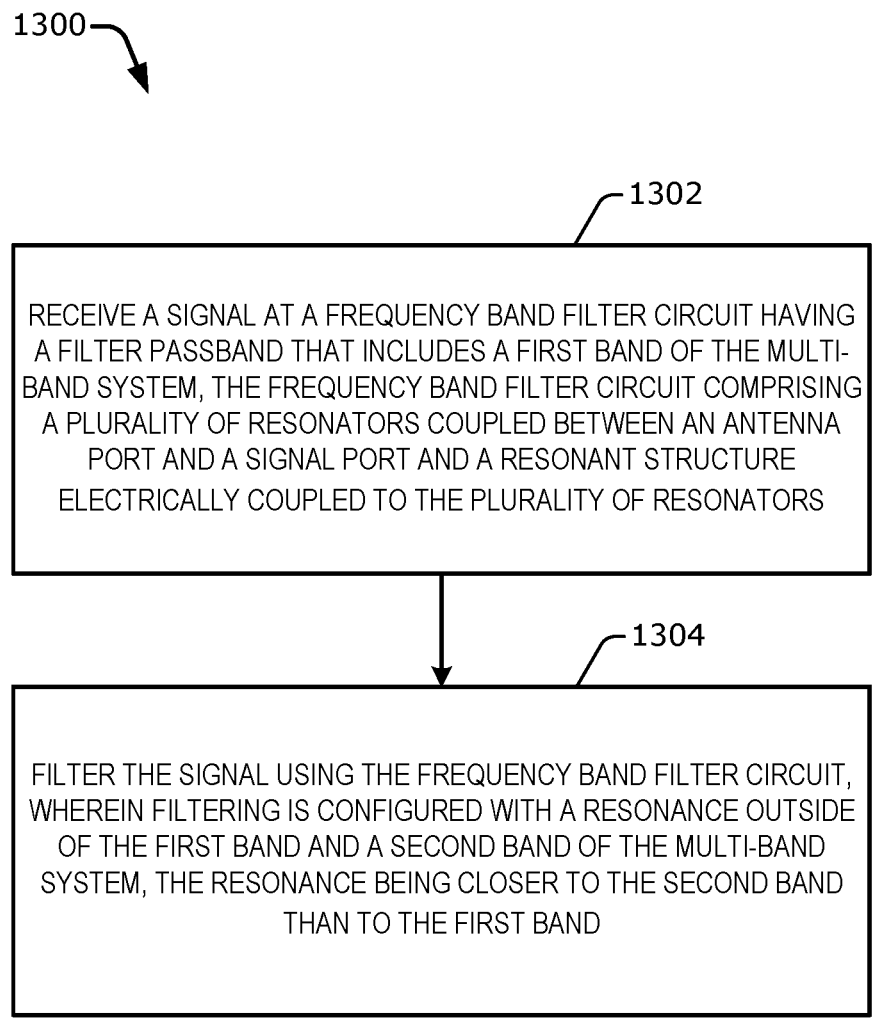
FIG. 13 is a flow chart illustrating an example of a method for filtering a signal in a wireless communication apparatus for a multi-band system in accordance with examples described herein.

FIG. 13 is a flow chart illustrating an example of a method 1300 for filtering a signal in a wireless communication apparatus for a multi-band system. The method 1300 is described in the form of a set of blocks that specify operations that can be performed. However, operations are not necessarily limited to the order shown in FIG. 13 or described herein, for the operations may be implemented in alternative orders or in fully or partially overlapping manners. Also, more, fewer, and/or different operations may be implemented to perform the method 1300, or an alternative approach.

At block 1302, the method 1300 includes operations to receive a signal at a frequency band filter circuit having a filter passband that includes a first band of the multi-band system. In some examples, the frequency band filter circuit includes a plurality of resonators coupled between an antenna port (e.g., a port coupled to or configured to be coupled to an antenna of a device) and a signal port (e.g., a port coupled or configured to be coupled to processing circuitry of a device). The frequency band filter circuit further includes a resonant structure electrically coupled to the plurality of resonators. Examples of such structures and resonators are described in FIGS. 6A, 6B, 10A-10F, and throughout this specification.

At block 1302, the method 1300 includes operations to filter the signal using the frequency band filter circuit, where filtering is configured with a resonance outside of the first band and a second band of the multi-band system, the resonance being closer to the second band than to the first band. One example of such filtering is described above with respect to FIG. 7. Additional examples can include the resonance from the resonant circuit configured in different ways with respect to passbands of a multi-band device.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. As part of such operations, method 1300 described above can further include blocks to perform any additional functions described for any filter or resonant structure described herein.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A wireless communication apparatus for a multi-band system, the wireless communication apparatus comprising:
 a frequency band filter circuit having a filter passband that includes a first band of the multi-band system, the frequency band filter circuit comprising:
  a plurality of resonators coupled between an antenna port and a signal port; and
  a resonant structure electrically coupled to the plurality of resonators, wherein the resonant structure has a resonance outside of the first band and a second band of the multi-band system, the resonance being closer to the second band than to the first band, wherein the resonant structure reduces a phase angle of an antenna reflection coefficient in the second band, wherein the resonant structure comprises:
   an input coupled to the signal port via the plurality of resonators other than the resonant structure;
   an output coupled to the antenna port;
   a first resonator having a first terminal coupled to the input, the first resonator having a second terminal coupled to the output; and
   a second resonator having a first terminal coupled to the first terminal of the first resonator, the second resonator having a second terminal coupled to a reference voltage.

2. The wireless communication apparatus of claim 1 further comprising:
 a plurality of frequency band filter circuits comprising the frequency band filter circuit for the first band, a frequency band filter circuit for the second band, and a frequency band filter circuit for a third band.

3. The wireless communication apparatus of claim 2, wherein the plurality of frequency band filter circuits comprise micro-electroacoustic filters implemented as surface acoustic wave devices.

4. The wireless communication apparatus of claim 2, wherein the plurality of frequency band filter circuits comprise micro-electroacoustic filters implemented as bulk acoustic wave devices.

5. The wireless communication apparatus of claim 2, comprising a second frequency band filter circuit for the second band of the multi-band system, the second frequency band filter circuit comprising:
a second plurality of resonators electrically coupled between the antenna port and a second signal port, wherein a second resonant structure of the second plurality of resonators has a second resonance outside of the first band and the second band of the multi-band system, the second resonance being closer to the first band than to the second band.

6. The wireless communication apparatus of claim 2, comprising a multiplexer circuit with switching circuitry, wherein the plurality of frequency band filter circuits implements a plurality of filters, wherein the multiplexer circuit with switching circuitry is configure to select between the plurality of filters, and wherein the multiplexer circuit comprises the frequency band filter circuit.

7. The wireless communication apparatus of claim 1, wherein the resonant structure comprises a third resonator having a first terminal coupled to the first terminal of the second resonator, the third resonator having a second terminal coupled to the second terminal of the second resonator.

8. The wireless communication apparatus of claim 7, wherein the resonant structure comprises one or more additional resonators coupled in parallel with the second resonator and the third resonator.

9. The wireless communication apparatus of claim 7, wherein the resonant structure comprises one or more additional resonators coupled in parallel with the first resonator.

10. The wireless communication apparatus of claim 1, wherein the first band is from 2110 Megahertz (MHz) to 2170 MHz.

11. The wireless communication apparatus of claim 10, wherein the second band is 2300 MHz to 2400 MHz.

12. The wireless communication apparatus of claim 1, wherein the multi-band system comprises the first band, the second band, and a third band between the first band and the second band, and wherein the resonance of the resonant structure is at a frequency between the third band and the second band.

13. The wireless communication apparatus of claim 1, wherein the resonant structure reduces a second phase angle of a second antenna reflection coefficient in a third band.

14. The wireless communication apparatus of claim 1, wherein the plurality of resonators configured to couple the signal port to the antenna port comprise:
a third resonator having a first terminal coupled to the signal port and a second terminal;
a fourth resonator having a first terminal connected to the second terminal of the third resonator, the fourth resonator having a second terminal connected to a ground;
a fifth resonator having a first terminal coupled to the second terminal of the third resonator, the fifth resonator having a second terminal connected to the resonant structure; and
a fourth sixth resonator having a first terminal connected to the second terminal of the fifth resonator, the fourth sixth resonator having a second terminal connected to the ground.

15. The wireless communication apparatus of claim 1, wherein the resonant structure comprises one or more additional resonators in series between a ground and the second terminal of the second resonator.

16. The wireless communication apparatus of claim 1, wherein the resonant structure comprises one or more additional resonators in series between the output of the resonant structure and the second terminal of the first resonator.

17. The wireless communication apparatus of claim 1, wherein the resonant structure comprises a plurality of additional resonators, each resonator of the plurality of additional resonators being configured:
in series between the output of the resonant structure and the second terminal of the first resonator;
in series between a ground and the second terminal of the second resonator;
in parallel with the first resonator; or
in parallel with the second resonator.

18. The wireless communication apparatus of claim 1, wherein the resonant structure is implemented in a shared substrate with the frequency band filter circuit.

19. The wireless communication apparatus of claim 1, wherein the resonant structure is implemented using surface mount components coupled to a substrate for the frequency band filter circuit.

20. The wireless communication apparatus of claim 1, wherein the resonant structure is implemented at least partially in a laminate carrier coupled to a substrate for the frequency band filter circuit.

21. The wireless communication apparatus of claim 1, comprising an antenna coupled to the antenna port; and processing circuitry coupled to the signal port.

22. The wireless communication apparatus of claim 1, comprising a mobile communication device including a transceiver circuit, wherein the transceiver circuit includes the frequency band filter circuit.

23. The wireless communication apparatus of claim 1, wherein the plurality of resonators and one or more resonators of the resonant structure are micro-acoustic.

24. A wireless communication apparatus for a multi-band system, the wireless communication apparatus comprising:
a frequency band filter circuit for a first band of the multi-band system, the frequency band filter circuit comprising:
an antenna port;
a signal port for transmitting and receiving signals in the first band; and
a plurality of resonators configured to couple the signal port to the antenna port, wherein a resonant structure of the plurality of resonators has a resonance outside of the first band and a second band of the multi-band system, the resonance being centered at a frequency greater than a threshold range outside of the first band, wherein the resonant structure reduces a phase angle of an antenna reflection coefficient in the second band, wherein the plurality of resonators comprises a first resonator having a first terminal coupled to an input for the plurality of resonators, the first resonator having a second terminal coupled to an output for the plurality of resonators, and a second resonator having a first terminal coupled to the first terminal of the first resonator, the second resonator having a second terminal coupled to a reference voltage.

25. The wireless communication apparatus of claim 24, wherein the multi-band system comprises the first band, the second band, and a third band between the first band and the second band, and wherein the resonance of the resonant structure is at a frequency between the third band and the second band.

26. A wireless communication device for a multi-band system, the wireless communication device comprising:
- a plurality of frequency band filter circuits;
- a multiplexer configured to multiplex signals between the plurality of frequency band filter circuits and one or more antennas;
- processing circuitry coupled to the plurality of frequency band filter circuits; and
- a first frequency band filter circuit of the plurality of frequency band filter circuits having a passband including a first frequency band, the first frequency band filter circuit comprising:
  - a plurality of resonators coupled between the multiplexer and a filter input port; and
  - a resonant structure electrically coupled to the plurality of resonators, wherein the resonant structure has a resonance outside of the first frequency band and a second frequency band of the multi-band system, the resonance being closer to the second frequency band than to the first frequency band, and wherein the second frequency band is associated with a second frequency band filter circuit of the plurality of frequency band filter circuits, wherein the resonant structure reduces a phase angle of an antenna reflection coefficient in the second frequency band, wherein the resonant structure comprises:
    - an input coupled to the plurality of resonators other than the resonant structure;
    - a first resonator having a first terminal coupled to the input, the first resonator having a second terminal coupled to an output of the resonant structure; and
    - a second resonator having a first terminal coupled to the first terminal of the first resonator, the second resonator having a second terminal coupled to a reference voltage.

27. A method of filtering a signal in a wireless communication apparatus for a multi-band system, the method comprising:
- receiving the signal at a frequency band filter circuit having a filter passband that includes a first band of the multi-band system, the frequency band filter circuit comprising a plurality of resonators coupled between an antenna port and a signal port and a resonant structure electrically coupled to the plurality of resonators, wherein the resonant structure comprises an input coupled to the signal port via the plurality of resonators other than the resonant structure, an output coupled to the antenna port, a first resonator having a first terminal coupled to the input, the first resonator having a second terminal coupled to the output, and a second resonator having a first terminal coupled to the first terminal of the first resonator, the second resonator having a second terminal coupled to a reference voltage; and
- filtering the signal using the frequency band filter circuit, wherein filtering is configured with a resonance outside of the first band and a second band of the multi-band system, the resonance being closer to the second band than to the first band, wherein the filtering reduces a phase angle of an antenna reflection coefficient in the second band.

* * * * *